(12) United States Patent
Kim et al.

(10) Patent No.: US 12,327,805 B2
(45) Date of Patent: Jun. 10, 2025

(54) PACKAGED POWER AMPLIFIER DEVICE

(71) Applicant: NXP USA, Inc., Austin, TX (US)

(72) Inventors: Kevin Kim, Chandler, AZ (US); Vikas Shilimkar, Chandler, AZ (US); Joseph Gerard Schultz, Wheaton, IL (US)

(73) Assignee: NXP USA, INC., Austin, TX (US)

( * ) Notice: Subject to any disclaimer, the term of this patent is extended or adjusted under 35 U.S.C. 154(b) by 522 days.

(21) Appl. No.: 17/823,116

(22) Filed: Aug. 30, 2022

(65) Prior Publication Data

US 2024/0071960 A1    Feb. 29, 2024

(51) Int. Cl.
    *H03F 3/195*    (2006.01)
    *H01L 23/66*    (2006.01)
    *H03F 1/02*     (2006.01)
    *H03F 3/24*     (2006.01)

(52) U.S. Cl.
    CPC ........... *H01L 23/66* (2013.01); *H03F 1/0288* (2013.01); *H03F 3/195* (2013.01); *H03F 3/245* (2013.01); *H01L 2223/6611* (2013.01); *H01L 2223/6622* (2013.01); *H01L 2223/6655* (2013.01); *H03F 2200/451* (2013.01)

(58) Field of Classification Search
    CPC .................................. H03F 3/195; H03F 1/02
    USPC ...................... 330/307, 124 R, 295
    See application file for complete search history.

(56) References Cited

U.S. PATENT DOCUMENTS

| | | | |
|---|---|---|---|
| 6,724,079 B2 | 4/2004 | Viswanathan et al. | |
| 6,844,221 B2 | 1/2005 | Viswanathan et al. | |
| 9,013,246 B2 | 4/2015 | Holmes et al. | |
| 9,202,782 B2 | 12/2015 | Chuah | |
| 9,252,085 B2 | 2/2016 | Weinschenk | |
| 9,986,646 B2 | 5/2018 | Viswanathan et al. | |
| 10,784,149 B2 | 9/2020 | Costa et al. | |

(Continued)

FOREIGN PATENT DOCUMENTS

| | | |
|---|---|---|
| EP | 3376535 A1 | 9/2018 |
| EP | 3982406 A2 | 4/2022 |

OTHER PUBLICATIONS

Dinulovic et al.: "Power Microtransformer on Silicon Embedded into PCB", 2021 Third International Symposium on 3D Power Electronics Integration and Manufacturing (3D-PEIM), Conference Paper—Publisher: IEEE, 2021, 4 pages.

(Continued)

*Primary Examiner* — Henry Choe
(74) *Attorney, Agent, or Firm* — Sherry W. Gourlay

(57) ABSTRACT

A power amplifier device includes a substrate, a power transistor die, and one or more surface mount components. The substrate has substrate die contacts exposed at a first substrate surface, and additional substrate contacts exposed at a second substrate surface. The power transistor die includes an integrated transistor. The transistor includes a control terminal and a first current conducting terminal coupled, respectively, to first and second die contacts at the first die surface, and a second current conducting terminal coupled to a third die contact at a second die surface. The surface-mount components are connected to the additional substrate components, and the surface-mount components are electrically coupled through the substrate to the first and second die contacts. The power amplifier device also includes an encapsulation material layer covering the surface-mount components and the second substrate surface.

21 Claims, 13 Drawing Sheets

(56) References Cited

U.S. PATENT DOCUMENTS

| | | |
|---|---|---|
| 10,903,182 B1 | 1/2021 | Wang et al. |
| 11,190,146 B2 | 11/2021 | Srinidhi Embar et al. |
| 2002/0074146 A1 | 6/2002 | Okubora |
| 2003/0165052 A1 | 9/2003 | Negishi et al. |
| 2008/0315398 A1 | 12/2008 | Lo et al. |
| 2010/0155931 A1 | 6/2010 | Ray et al. |
| 2018/0159479 A1 | 6/2018 | Wu et al. |
| 2020/0203291 A1 | 6/2020 | Uejima |
| 2021/0111091 A1 | 4/2021 | Uppal et al. |
| 2021/0175854 A1 | 6/2021 | Hue et al. |
| 2021/0313282 A1 | 10/2021 | Noori et al. |
| 2021/0313284 A1 | 10/2021 | Noori et al. |
| 2021/0313285 A1 | 10/2021 | Noori et al. |
| 2021/0313293 A1 | 10/2021 | Noori et al. |
| 2022/0115301 A1 | 4/2022 | Bowers et al. |

OTHER PUBLICATIONS

Kuo et al: "High Efficiency Power Electronic Module with Embedded Die", 2016 IEEE CPMT Symposium Japan (ICSJ), Conference Paper, Publisher IEEE, 2016, 4 pages.
Mark Lapedus "Embedded Die Packaging Emerges", Semiconductor Engineering, Apr. 9, 2018, 15 pages.
U.S. Appl. No. 17/823,122, filed Aug. 30, 2022, 57 pages.
U.S. Appl. No. 17/823,127, filed Aug. 30, 2022, 62 pages.
U.S. Appl. No. 18/054,971, filed Nov. 14, 2022, 74 pages.
U.S. Appl. No. 17/823,122 Notice of Allowance issued Apr. 2, 2025, 7 pages.

PACKAGED POWER AMPLIFIER DEVICE

TECHNICAL FIELD OF THE INVENTION

The present invention relates generally to power amplifiers that are packaged in semiconductor device packages.

BACKGROUND OF THE INVENTION

Wireless communication systems employ power amplifiers for increasing the power of radio frequency (RF) signals. Power amplifiers may be implemented in various ways, with a majority of power amplifiers being implemented on a printed circuit board (PCB). Circuit board implementations of power amplifiers may include, for example, input/output (I/O) connectors (e.g., coax connectors), surface mount components coupled to the surface of the PCB, and printed traces on the PCB that interconnect the connectors and the surface mount components.

In some cases, the primary amplification portion of the power amplifier includes a transistor die that is packaged in a high-power package. The high power package may include a conductive flange and I/O terminals that are electrically isolated from the conductive flange (e.g., using a dielectric window frame). One or more transistor dies are connected to the conductive flange, along with components associated with impedance matching circuits. Wirebond arrays are used to electrically connect the transistor dies and the impedance matching components to each other and to the I/O terminals.

Uniform propagation of RF signals across the impedance matching circuits is important to achieve highly efficient power amplifier circuits. Unfortunately, wirebond array characteristics and the space constraints due to assembly rule requirements inherently may result in non-uniform feeding of RF signals through the wirebond arrays. This may result in poorly matched transistors, which in turn may result in lower power and lower efficiency power amplifiers.

Further, amplifier specifications for higher-band amplifiers increasingly require the minimization of inductances, which can be difficult in conventional power transistor packages that implement wirebond arrays. Accordingly, power amplifier designs are needed that overcome these issues.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

Figure 1:
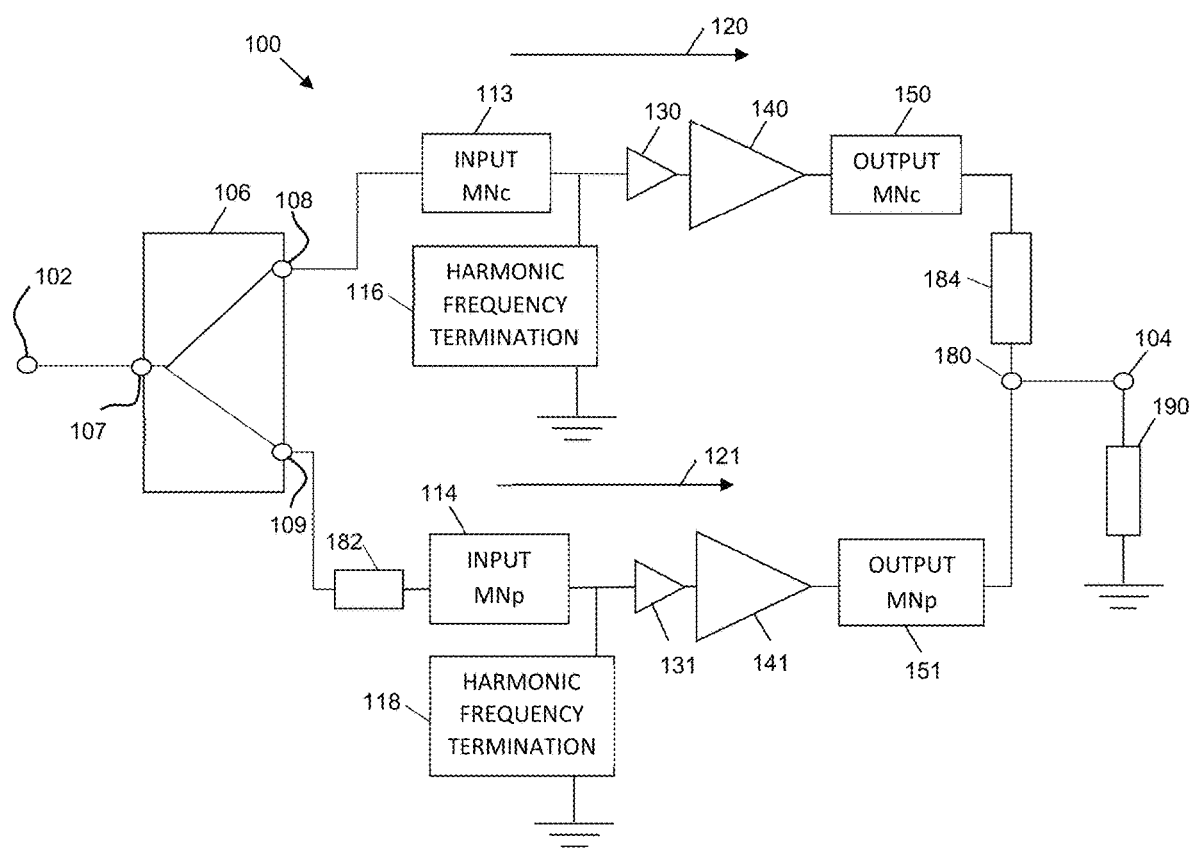
FIG. 1 is a simplified circuit diagram of a multi-path power amplifier, according to an embodiment.

Embodiments of power amplifiers described herein reduce or eliminate wirebond arrays from the amplifier circuits, which may provide for increased amplifier power and efficiency, and minimized inductances that may enable compliance with higher band specifications. In addition, embodiments of power amplifiers described herein may facilitate miniaturization of RF amplifiers, which increasingly is becoming a critical aspect of power amplifier designs. Further still, in embodiments in which wirebond arrays are eliminated completely, the expensive wirebond assembly steps and wirebonder equipment may be eliminated.

An embodiment of a power amplifier device includes a substrate, at least one power transistor die, and one or more surface-mount components. The substrate is formed from a stack of multiple dielectric layers and multiple patterned conductive layers in an alternating arrangement, and a plurality of conductive vias electrically connecting the patterned conductive layers. The substrate has first and second substrate die contacts exposed at a first substrate surface, and a plurality of additional substrate contacts exposed at a second substrate surface. The power transistor die includes first and second die contacts at a first die surface, and which are connected to the first and second substrate contacts, respectively. The power transistor die also includes a third die contact at a second die surface, and at least one integrated transistor. Each integrated transistor includes a control terminal coupled to the first die contact, a first current conducting terminal coupled to the second die contact, and a second current conducting terminal coupled to the third die contact. The surface-mount component(s) are connected to the plurality of additional substrate contacts at the second substrate surface. The surface-mount component(s) are electrically coupled through the patterned conductive layers and the conductive vias to the first and second die contacts. Finally, the power amplifier device includes an encapsulation material layer covering the surface-mount component(s) and the second substrate surface. The encapsulation material layer defines the second surface of the power amplifier device.

The power amplifier device embodiments described herein may be used to implement various types of amplifiers. Embodiments may be well suited for amplifiers that include multiple power transistor dies, each associated with an amplification stage (e.g., amplifiers with a series-coupled pre-amplifier and final stage amplifier). The embodiments also may be particularly well suited for multiple-path amplifiers (e.g., a multi-path amplifier with a main (or primary) amplifier and one or more auxiliary amplifiers implemented in series or parallel) and/or for amplifiers with transistor dies that generate high heat. For purpose of example, some of the below-described embodiments will be described in the context of a Doherty power amplifier, which is one non-limiting example of a multi-path amplifier in which the invention may be practiced. In fact, use of the below-described embodiments to provide a Doherty power amplifier may result in significant improvements in Doherty power amplifier performance and/or significantly reduced size. A schematic of a Doherty power amplifier will be described next in order to provide adequate context for the description of the various embodiments.

FIG. 1 is a simplified schematic diagram of a multiple-path power amplifier, and more specifically, a Doherty power amplifier 100, which may be embodied in an embodiment of an amplifier device, discussed later. Amplifier 100 includes an input terminal 102, an output terminal 104, a power divider 106 (or splitter), a carrier amplifier path 120, a peaking amplifier path 121, and a combining node 180. A load 190 may be coupled to the combining node 180 (e.g., through the output terminal 104 and an impedance transformer, not shown) to receive an amplified RF signal from amplifier 100.

Power divider 106 includes an input terminal 107 and two output terminals 108, 109. An input RF signal received at input terminal 102 is conveyed to the input terminal 107 of the power divider 106, which divides the power of the input RF signal into carrier and peaking portions of the input signal. The carrier input signal is provided to the carrier amplifier path 120 at power divider output 108, and the peaking input signal is provided to the peaking amplifier path 121 at power divider output 109. During operation in a full-power mode when both the carrier and peaking amplifiers 140, 141 are supplying current to the load 190, the power divider 106 divides the input signal power between the amplifier paths 120, 121. For example, the power divider 106 may divide the power equally, such that roughly one half of the input signal power is provided to each path 120, 121 (e.g., for a symmetric Doherty amplifier configuration). Alternatively, the power divider 106 may divide the power unequally (e.g., for an asymmetric Doherty amplifier configuration).

Essentially, the power divider 106 divides an input RF signal supplied at the input terminal 102 into carrier and peaking signals, and the carrier and peaking signals are separately amplified along the carrier and peaking amplifier paths 120, 121, respectively. The amplified carrier and peaking signals are then combined in phase at the combining node 180. It is important that phase coherency between the carrier and peaking amplifier paths 120, 121 is maintained across a frequency band of interest to ensure that the amplified carrier and peaking signals arrive in phase at the combining node 180, and thus to ensure proper Doherty amplifier operation.

Each of the carrier amplifier and peaking amplifier paths 120, 121 includes one or more single-stage or multiple-stage power transistor integrated circuits (ICs) (or power transistor dies) for amplifying the RF signals conducted through the amplifier path. As shown in FIG. 1, the carrier amplifier path 120 includes a two-stage amplifier, which includes a pre-amplifier stage 130 and a final amplifier stage 140 (referred to collectively as the carrier amplifier 130, 140). Similarly, the peaking amplifier path 121 includes a two-stage amplifier, which includes a pre-amplifier stage 131 and a final amplifier stage 141 (referred to collectively as the peaking amplifier 131, 141). In each path, the pre-amplifier and final amplifier stages may be integrated into a single power transistor IC, or the pre-amplifier and final amplifier stages may be integrated into two separate power transistor ICs. According to various embodiments, all amplifier stages or a final amplifier stage of either or both the carrier amplifier 130, 140 and/or the peaking amplifier 131, 141 may be implemented, for example, using a III-V field effect transistor (e.g., a HEMT), such as a gallium nitride (GaN) field effect transistor (FET) (or another type of III-V transistor, including a GaAs FET, a GaP FET, an InP FET, or an InSb FET). Where only one stage of the carrier amplifier 130, 140 or one stage of the peaking amplifier 131, 141 is implemented as a III-V FET, the other amplifier stage may be implemented as a silicon-based FET (e.g., an LDMOS FET) or a silicon germanium (SiGe) FET, in some embodiments. In still other embodiments, some or all of the amplifier stages may be implemented using silicon-based LDMOS (laterally diffused metal oxide semiconductor) transistors, SiGe transistors, or other types of transistors.

Although the carrier and peaking power transistor ICs may be of equal size (e.g., in a symmetric Doherty configuration), the carrier and peaking power transistor ICs may have unequal sizes, as well (e.g., in various asymmetric Doherty configurations). In an asymmetric Doherty configuration, the peaking power transistor IC(s) typically are larger than the carrier power transistor IC(s) by some multiplier. For example, the peaking power transistor IC(s) may be twice the size of the carrier power transistor IC(s) so that the peaking power transistor IC(s) have twice the current carrying capability of the carrier power transistor IC(s). Peaking-to-main amplifier IC size ratios other than a 2:1 ratio may be implemented, as well.

During operation of Doherty amplifier 100, the carrier amplifier 130, 140 is biased to operate in class AB mode, and the peaking amplifier 131, 141 is biased to operate in class C mode. At low power levels, where the power of the input signal at terminal 102 is lower than the turn-on threshold level of peaking amplifier 131, 141, the amplifier 100 operates in a low-power (or back-off) mode in which the carrier amplifier 130, 140 is the only amplifier supplying current to the load 190. When the power of the input signal exceeds a threshold level of the peaking amplifier 131, 141, the amplifier 100 operates in a high-power mode in which the carrier amplifier 130, 140 and the peaking amplifier 131, 141 both supply current to the load 190. At this point, the peaking amplifier 131, 141 provides active load modulation at combining node 180, allowing the current of the carrier amplifier 130, 140 to continue to increase linearly.

Optionally, input and output impedance matching networks 113, 150 (input MNc, output MNc) may be implemented at the input and/or output of the carrier amplifier 130, 140. Similarly, input and output impedance matching networks 114, 151 (input MNp, output MNp) optionally may be implemented at the input and/or output of the peaking amplifier 131, 141. In each case, the matching networks 113, 114, 150, 151 may be used to transform the gate and drain impedances of carrier amplifier 130, 140 and peaking amplifier 131, 141 to a more desirable system level impedance, as well as manipulate the signal phases to ensure proper Doherty amplifier operation. In various embodiments, all or portions of the input and output impedance matching networks 113, 114, 150, 151, if included, may be implemented inside a power amplifier package that includes the carrier and/or peaking amplifiers 140, 141.

In addition, embodiments of packaged amplifiers may include harmonic frequency termination circuits 116, 118 coupled between the inputs of amplifiers 140, 141 and a ground reference. In addition or alternatively, packaged amplifiers may include harmonic frequency termination circuits coupled between the outputs of amplifiers 140, 141 and a ground reference. Either way, the harmonic frequency termination circuits 116, 118 are configured to control the harmonic impedance across a relatively wide fractional bandwidth. For example, the harmonic frequency termination circuits 116, 118 may provide a low impedance path to ground for signal energy at the second harmonic of the center frequency of operation, $f_o$, of the amplifier 100 (also referred to herein as the "fundamental frequency" of operation).

Doherty amplifier 100 has a "non-inverted" load network configuration. In the non-inverted configuration, the input circuit is configured so that an input signal supplied to the peaking amplifier 131, 141 is delayed by 90 degrees with respect to the input signal supplied to the carrier amplifier 130, 140 at the center frequency of operation, $f_o$, of the amplifier 100. To ensure that the carrier and peaking input RF signals arrive at the carrier and peaking amplifiers 140, 141 with about 90 degrees of phase difference, as is fundamental to proper Doherty amplifier operation, phase delay element 182 applies about 90 degrees of phase delay to the peaking input signal. For example, phase delay element 182 may include a quarter wave transmission line, or another suitable type of delay element with an electrical length of about 90 degrees.

The 90 degree phase delay difference between the carrier and peaking amplifier paths 120, 121 at the inputs of amplifiers 140, 141 compensates for a 90 degree phase delay applied to the signal between the output of carrier amplifier 130, 140 and the combining node 180 (i.e., to ensure that the amplified signals arrive in phase at the combining node 180). This is achieved through an additional delay element 184, which also is configured to perform an impedance inversion (i.e., element 184 may be referred to as a phase delay/impedance inversion element). Alternate embodiments of Doherty amplifiers may have an "inverted" load network configuration. In such a configuration, the input circuit is configured so that an input signal supplied to the carrier amplifier 130, 140 is delayed by about 90 degrees with respect to the input signal supplied to the peaking amplifier 131, 141 at the center frequency of operation, $f_o$, of the amplifier 100. Additionally, the output circuit is configured so that an output signal supplied to the combining node 180 by the peaking amplifier 131, 141 is delayed by about 90 degrees with respect to the main amplifier 130, 140 at the center frequency of operation, $f_o$, of the amplifier 100.

Amplifiers 140 and 141, splitter 106, harmonic frequency termination circuits 116, 118, matching networks 113, 114, 150, 151, and delay elements 182, 184 all may be implemented in a discrete, packaged power amplifier device, in accordance with various embodiments. In such devices, the input and output terminals 102, 104 are coupled to corresponding pads on a system substrate (e.g., a PCB). The harmonic frequency termination circuits 116, 118 and the input and output matching networks 113, 114, 150, 151 also may be implemented as additional components within the packaged amplifier. Baseband decoupling circuits, bias circuits, and other circuits also may be implemented as additional components within the packaged amplifier device.

Figure 2A:
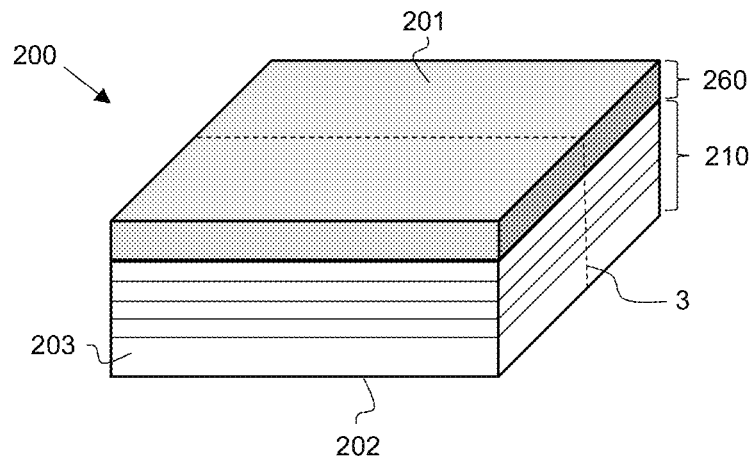
FIGS. 2A and 2B are perspective views showing the top and bottom surfaces, respectfully, of a power amplifier device, according to an example embodiment.
Figure 2B:
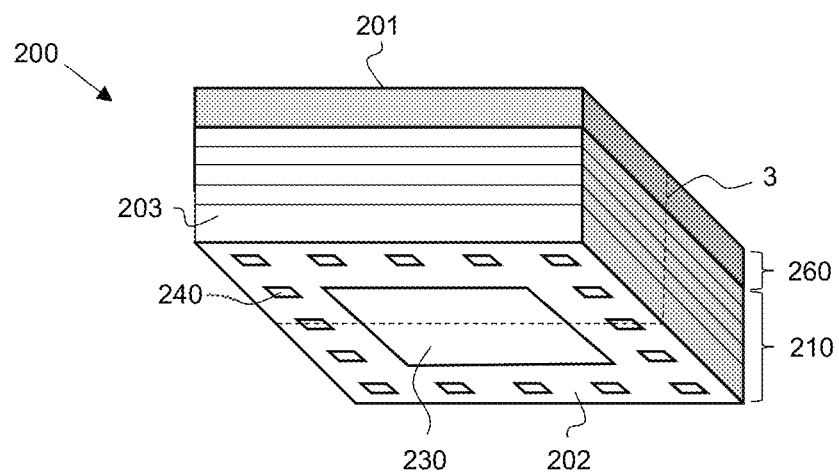

Turning now to FIGS. 2A and 2B (referred to collectively as FIG. 2), an embodiment of a power amplifier device 200 is depicted. More specifically, FIGS. 2A and 2B are perspective views showing the upper and lower surfaces 201, 202, respectfully, of a power amplifier device 200, according to an example embodiment.

The power amplifier device 200 has a device body shaped as a rectangular prism. The device body, and thus the device 200, is defined by a first device surface 201 (referred to herein as the upper device surface) and an opposed second device surface 202 (referred to herein as the lower device surface). Four device sidewalls (e.g., sidewall 203) extend between the upper and lower device surfaces 201, 202.

The device body includes an encapsulation material layer 260 connected to a substrate 210. The substrate 210, which partially defines the lower device surface 202 in some embodiments, is formed from a stack of multiple dielectric layers and multiple patterned conductive layers in an alternating arrangement. As will be discussed in more detail later in conjunction with FIG. 3, one or more power transistor dies (e.g., dies 340, 341, FIG. 3) are connected to substrate die contacts (e.g., contacts 330-333, FIG. 3) exposed at a first surface of the substrate 210 (e.g., substrate surface 311, FIG. 3). The first substrate surface is recessed below the lower device surface 202, and a thermal structure 230 contacts the embedded die(s) and extends outward to define a portion of the lower device surface 202.

According to an embodiment, a plurality of conductive interconnects 240 (e.g., interconnects 240-1, 240-2, FIG. 3) have distal ends exposed at the lower device surface 202. The conductive interconnects 240 extend into the die body, and their proximal ends are connected to additional substrate contacts and/or to the patterned conductive layers of the substrate 210. Essentially, the conductive interconnects 240 function as terminals configured to receive and convey RF signals, bias voltages, and ground connections to the amplifier circuitry (e.g., dies and surface mount components) embedded within the die body.

Figure 3:
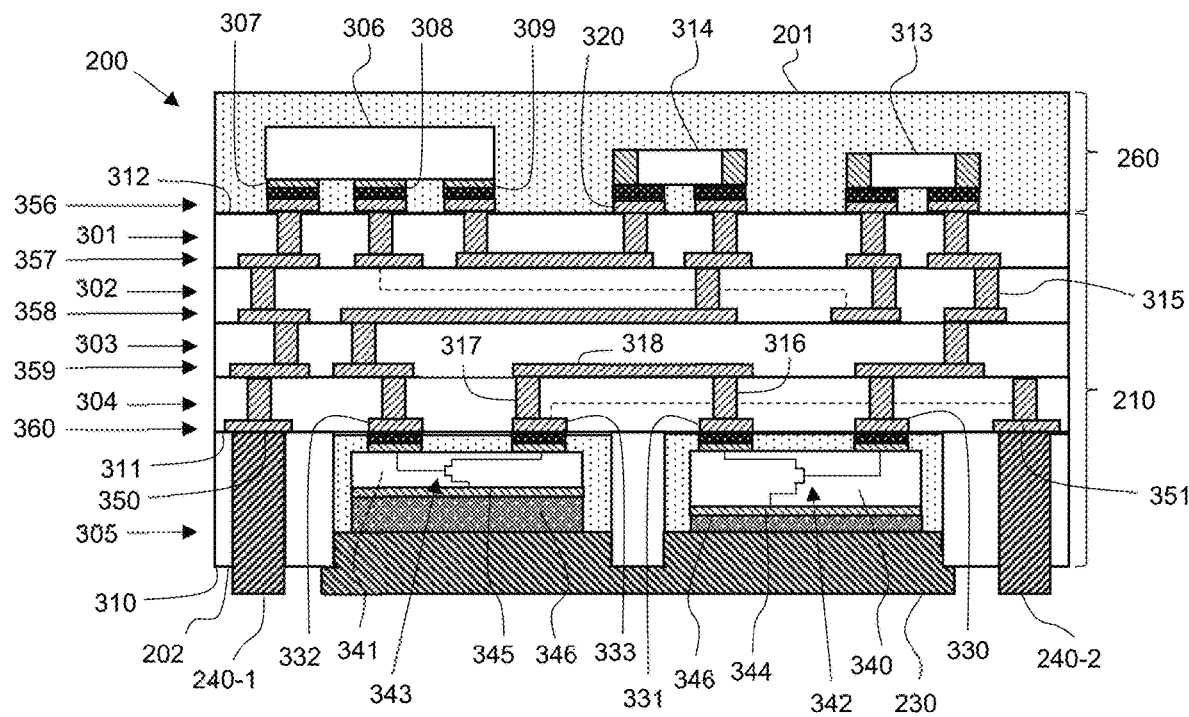
FIG. 3 is a side, cross-sectional view of the power amplifier device of FIGS. 2A and 2B along bisection line 3, according to an example embodiment.

In addition, one or more surface mount components (e.g., components 306, 313, 314, FIG. 3) are connected to additional substrate contacts (e.g., contact 320, FIG. 3) that are exposed at a second surface of the substrate 210 (e.g., substrate surface 312, FIG. 3). The encapsulation material layer 260 covers the surface mount component(s) and the second substrate surface, and substantially defines the upper device surface 201.

FIG. 3 is a side, cross-sectional view of the power amplifier device 200 of FIGS. 2A and 2B along bisection line 3, according to an example embodiment. As discussed in conjunction with FIGS. 2A and 2B, the device body includes an encapsulation material layer 260 connected to a substrate 210. The substrate 210 is formed from a stack of multiple dielectric layers 301, 302, 303, 304, 305 and multiple patterned conductive layers 356, 357, 358, 359, 360 in an alternating arrangement. A lower surface 310 of the substrate partially defines the lower device surface 202. A plurality of conductive vias (e.g., via 315) electrically connect the patterned conductive layers 356-360. Substrate die contacts 330, 331, 332, 333 are exposed at a first surface 311 of the substrate 210, and additional substrate contacts 320 are exposed at a second surface 312 of the substrate 210.

In the illustrated embodiment, one or more openings in one or more outer layers 305 of the substrate 210 expose one or more portions of the first substrate surface 311 at which the substrate die contacts 330-333 are exposed. According to an embodiment, two power transistor dies 340, 341 are connected to the substrate die contacts 330-333, and thus are connected to the first substrate surface 311. The first substrate surface 311 is recessed below the lower device surface 202, and a thermal structure 230 that extends into the die openings thermally couples to the embedded dies 340, 341 and extends outwardly to define a portion of the lower device surface 202.

According to an embodiment, a first embedded die 340 is a power transistor die that includes at least one integrated transistor 342 (e.g., Si, GaN, SiGe, HEMT, LDMOS, etc.) that functions as the carrier amplifier (e.g., carrier amplifier 130, 140, FIG. 1). In addition, a second embedded die 341 also includes at least one integrated power transistor 343 (e.g., Si, GaN, SiGe, HEMT, LDMOS, etc.) that functions as the peaking amplifier (e.g., peaking amplifier 131, 141, FIG. 1). An enlarged depiction of a power transistor 380 that would be suitable for integration within the dies 340, 341 is shown in FIG. 3 below the power amplifier device 200. The power transistor 380 includes a gate terminal 381, a drain terminal 382, and a source terminal 383. As can be seen in the cross-section of device 200, the gate and drain terminals of each transistor 342, 343 are coupled to gate and drain contacts (not numbered) that are exposed at first die surfaces of the dies 340, 341. The gate and drain contacts, in turn, are coupled to (e.g., soldered to) the substrate die contacts 330-333. The source terminal of each transistor 342, 343 is coupled to a conductive bottom layer 344, 345 of each die 340, 341, and the conductive bottom layer 344, 345 defines a second die surface of each die 340, 341.

According to an embodiment, the gate and/or drain contacts of the dies 340, 341 may be elongated (e.g., they may have a length dimension that is significantly greater than a width dimension). For example, the drain contact of a die 340, 341 may have a length dimension that is at least five times greater than a width dimension of the drain contact. According to a further embodiment, each of the substrate die contacts 330-333 are shaped and sized to correspond to the shape and size of the gate or drain contact to which the substrate die contact 330-333 is connected. In other words, the substrate die contacts 330-333 also may be elongated, and further may have shapes and sizes that ensure good connection along the entire lengths of the gate and/or drain contacts of the dies 340, 341.

According to an embodiment, a thermal structure 230 extends into the opening (or openings) of the outermost substrate layer(s) 305, and is coupled (e.g., using die attach 346, solder, or other suitable conductive materials) to the conductive bottom layers 344, 345 of the power transistor dies 340, 341. As shown in FIG. 3, when the power transistor dies 340, 341 have different heights (vertical dimension in FIG. 3), the thickness of the die attach 346 may be different between each die 340, 341 and the thermal structure 230. Alternatively, the thermal structure 230 could be machined so that portions of the structure 230 that are coupled to the dies 340, 341 (e.g., "pedestals") have different heights to accommodate the different die heights. In such an embodiment, if the pedestal heights are configured so that each pedestal is the same distance from the corresponding die, the thickness of the die attach 346 can be the same for both dies 340, 341.

The outer surface of the thermal structure 230 corresponds to a portion of the lower surface 202 of the device 200. As will be explained in more detail later, the thermal structure 230 is configured to convey heat generated by the dies 340, 341 away from the dies 340, 341, and to an external system heat sink (e.g., heat extraction component 1130 or 1230, FIGS. 11, 12) associated with an amplifier system (e.g., a transmitter of a communication system).

As mentioned previously, a plurality of conductive interconnects 240-1, 240-2 (e.g., interconnects 240, FIG. 2) have distal ends exposed at the lower device surface 202. The conductive interconnects 240-1, 240-2 extend through the outermost substrate layer(s) 305, and their proximal ends are electrically connected to the patterned conductive layers 356-360 of the substrate 210. These connections may be made through interconnect contacts 350, 351. For example, the interconnect contacts 350, 351 may be positioned at the first substrate surface 311. As mentioned previously, the conductive interconnects 240 (FIG. 2) are configured to convey RF signals, bias voltages, control signals, and ground connections to the amplifier circuitry (e.g., dies 340, 341 and surface mount components 306, 313, 314) embedded within the device 200. In FIG. 3, conductive interconnect 240-1 more specifically corresponds to an RF input terminal (e.g., terminal 102, FIG. 1), and conductive interconnect 240-2 more specifically corresponds to an RF output terminal (e.g., terminal 104, FIG. 1).

The one or more surface mount components 306, 313, 314 are connected to additional substrate contacts 320 that are exposed at a second surface 312 of the substrate 210. The encapsulation material layer 260 covers the surface mount components 306, 313, 314 and the second substrate surface 312. The encapsulation material layer 260 essentially defines the upper device surface 201. According to an embodiment, sidewalls of the substrate 210 and the encapsulation material layer 260 that are on the same side of the device 200 are co-planar.

The surface mount components 306, 313, 314 can correspond to a number of components of an amplifier circuit (e.g., pre-amplifier transistors, power splitting circuitry, harmonic termination circuitry, inductors, capacitors, and impedance matching circuitry). For example, at least one surface mount component 306 may correspond to a power divider circuit (e.g., power divider 106, FIG. 1), which has an input terminal 307 (e.g., terminal 107, FIG. 1) and multiple output terminals 308, 309 (e.g., terminals 108, 109, FIG. 1). The power divider input terminal 307 is electrically coupled through a conductive path formed from portions of the patterned conductive substrate layers 356-360 and vias (e.g., via 315) to one of the conductive interconnects 240-1, which corresponds to the input terminal (e.g., input terminal 102, FIG. 1) of the amplifier.

The power divider circuit 306 also may have at least two output terminals 308, 309, where each output terminal is coupled to one of the inputs (e.g., drain terminals) of the transistors 342, 343 within the power transistor dies 340, 341. The output terminals 308, 309 of the power divider circuit 306 may be coupled to the inputs of the power transistor dies 340, 341 directly through conductive paths formed by the patterned conductive layers 356-360 and vias (e.g., via 315). Alternatively, as shown in FIG. 3, the output terminals 308, 309 of the power divider circuit 306 may be coupled through conductive paths in the substrate 210 to additional surface mount components 313, 314, which correspond to portions of input impedance matching circuits (e.g., circuits 113, 114, FIG. 1). Those additional surface mount components 313, 314, in turn, may be coupled to the inputs of the power transistor dies 340, 341 directly through conductive paths formed by the patterned conductive layers 356-360 and vias (e.g., via 315). Note that, in FIG. 3 and other figures described later, some conductive paths are indicated with dashed lines.

Accordingly, when an input RF signal is provided to interconnect 240-1, the input RF signal may be conveyed through the substrate 210 to the input terminal 307 of the power divider circuit 306, and the power divider circuit 306 may perform the function of splitting the input RF signal into multiple (e.g., two or more) separate signals (e.g., a carrier signal and a peaking signal). The separate signals provided at the power divider outputs 308, 309 may then be conveyed through the substrate 210 to the impedance matching components 313, 314 or directly to the inputs of the power transistor dies 340, 341. Although the power divider circuit 306 is shown as a single surface-mount component, in other embodiments, multiple surface mount components may be used to implement the power divider circuit 306.

Although not shown in FIG. 3, at least one additional surface-mount component may be used to implement a harmonic termination circuit (e.g., harmonic termination circuits 116, 118, FIG. 1) coupled between each amplification path and ground. For example, when a harmonic termination circuit includes a shunt LC circuit, at least part of the inductance (L) can be implemented using a series of conductive traces and vias of the patterned conductive layers 356-360, another part of the inductance (L) can be implemented with a surface mount component coupled to contacts at substrate surface 312, and the capacitance (C) can be a surface mount component coupled to additional contacts at substrate surface 312. The inductance (L) and capacitance (C) can be coupled in series through the patterned conductive layers 356-360. An input to each LC circuit can be coupled to a point along each of the amplification paths (e.g., a point before or after each power transistor), and an output to each LC circuit can be coupled through the patterned conductive layers 356-360 to another one of the conductive interconnects 240. When the device 200 is incorporated into a larger system, that conductive interconnect 240 can be coupled to ground.

As discussed in conjunction with FIG. 1, for a non-inverted Doherty amplifier, a phase delay element (e.g., phase delay element 182, FIG. 1) is coupled between the power divider 106 and the input to the peaking amplifier 131, 141. According to an embodiment, the phase delay element (e.g., phase delay element 182, FIG. 1) may be implemented using a conductive path through the substrate 210, which electrically couples an output of the power divider circuit 306 to an input (e.g., gate terminal) of the peaking amplifier die (e.g., the terminal of die 341 coupled to substrate contact 332). The conductive path corresponding to the phase delay element may have an electrical length of about 90 degrees, according to an embodiment.

As also discussed in conjunction with FIG. 1, the outputs of the carrier and peaking power amplifiers 140, 141 each are coupled to a combining node 180. According to an embodiment, the combining node is designed to be co-located with the output terminal (e.g., drain terminal) of the peaking amplifier die (e.g., the terminal of die 341 coupled to substrate contact 333). The impedance inverter/phase delay element (e.g., impedance inversion/phase delay element 184, FIG. 1) may be implemented using a conductive path through the substrate 210, which electrically connects the output terminal (e.g., drain terminal) of the carrier amplifier die 340 (e.g., the terminal of die 340 coupled to substrate contact 331) to the combining node at the output terminal (e.g., drain terminal) of the peaking amplifier die 341. For example, in FIG. 3, the output terminal of the carrier amplifier die 340 is electrically connected to the output terminal of the peaking amplifier die 341 through vias 316, 317 and conductive trace 318 (i.e., a portion of patterned conductive layer 359).

As also discussed in conjunction with FIG. 1, the combining node 180 is electrically coupled to the output terminal 104 of the amplifier. According to an embodiment, interconnect 240-2 functions as the output terminal of the amplifier device, and the output terminal (e.g., drain terminal) of the peaking amplifier die 341 is electrically coupled to interconnect 240-2 through a conductive path (indicated with a dashed line) through the substrate 210.

Although not shown in FIG. 3, some conductive interconnects 240 may be used to receive bias voltages, which may be conducted from the interconnects 240 to the power transistor dies 340, 341 through the patterned conductive layers 356-360 and conductive vias of the substrate 210. In addition, other conductive interconnects 240 may be used to provide a ground reference (e.g., they may be coupled to ground when device 200 is incorporated into a larger system). The ground connection between the ground interconnects 240 and other circuit components (e.g., some of surface mount devices 306, 313, 314) may be made through the patterned conductive layers 356-360 and conductive vias of the substrate 210. Still other conductive interconnects 240 may be used to convey control signals to components within device 200.

Accordingly, the power amplifier device 200 illustrated in FIGS. 2 and 3 may encompass a full Doherty amplifier circuit in a compact package. It may be noted that no wirebond arrays are used to interconnect the components of the Doherty amplifier. Therefore, in comparison with conventional Doherty amplifier circuits, the lack of wirebond arrays may result in increased amplifier power and efficiency. Further, minimized inductances inherent in the Doherty device embodiments described herein may enable compliance with higher band specifications.

Figure 4:
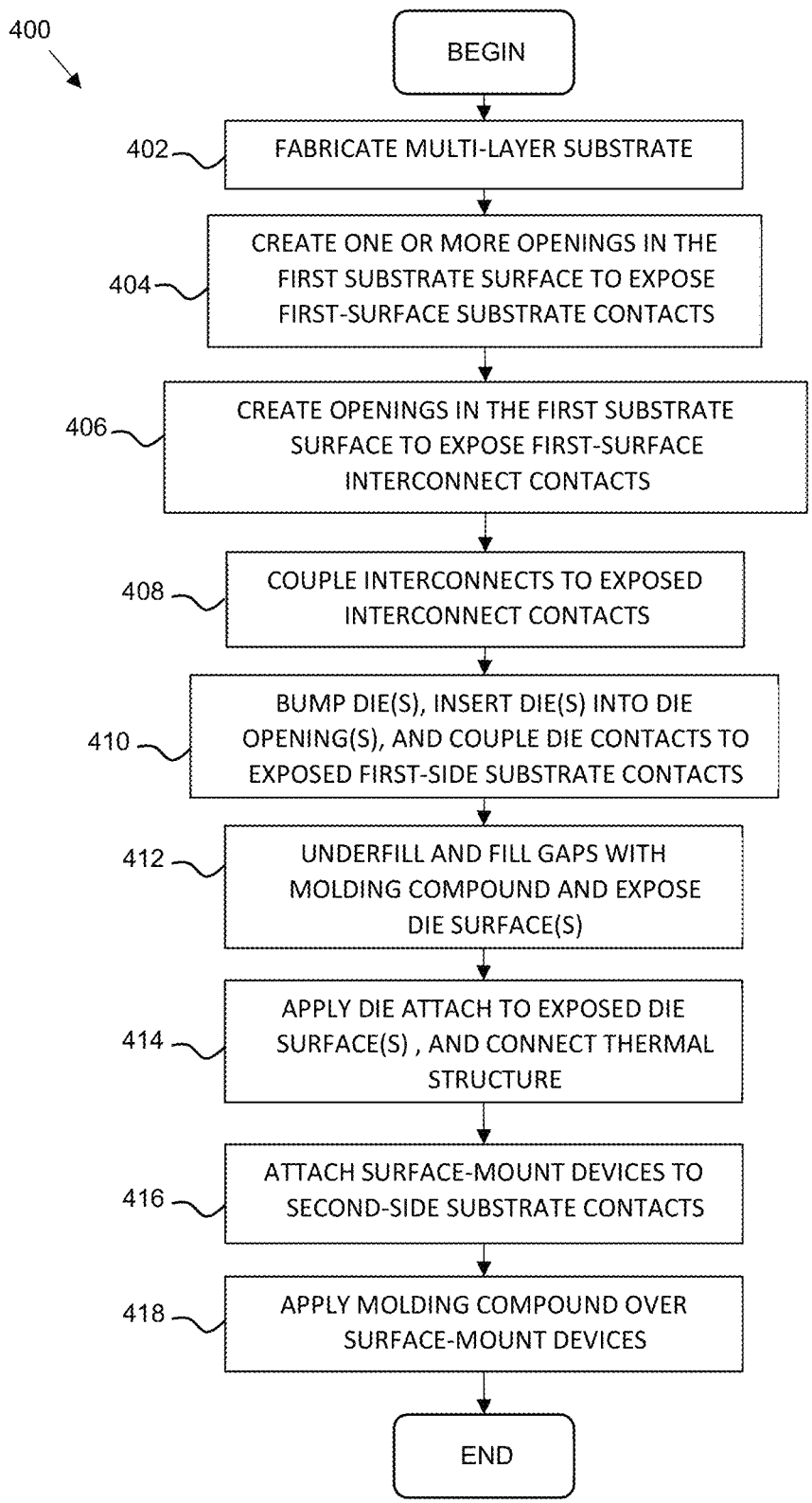
FIG. 4 is a flowchart of a method of manufacturing the power amplifier device of FIGS. 2 and 3, according to an example embodiment.

FIG. 4 is a flowchart of a method 400 of manufacturing the power amplifier device 200 of FIGS. 2 and 3, according to an example embodiment. For enhanced understanding, FIG. 4 should be viewed simultaneously with FIGS. 5-10, which are side, cross-sectional views of the power amplifier device of FIGS. 2 and 3 at various stages of manufacture, according to an embodiment.

Figure 5:
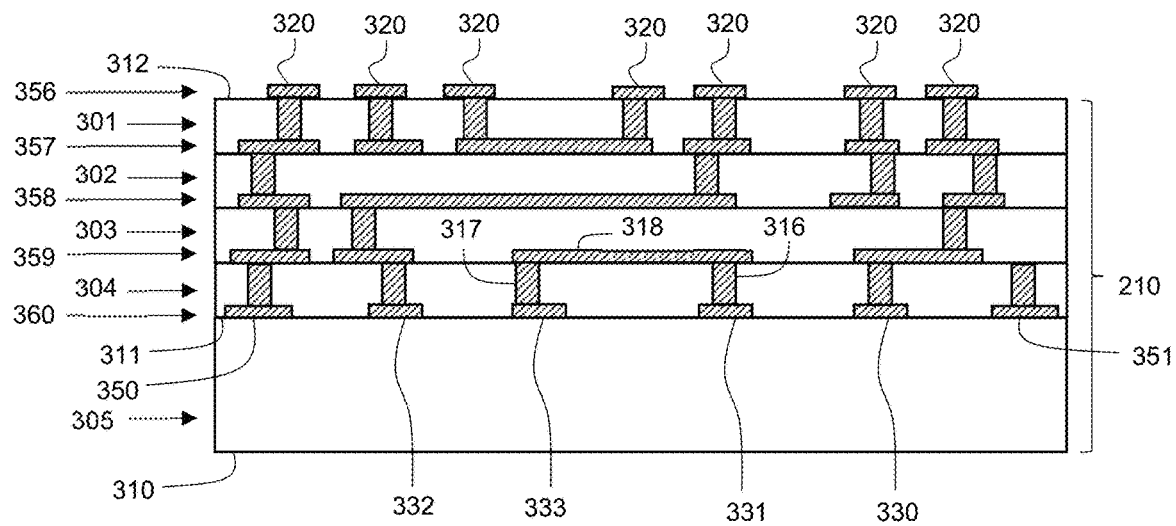
FIGS. 5-10 are side, cross-sectional views of the power amplifier device of FIGS. 2 and 3 at various stages of manufacture, according to an embodiment.

Referring also to FIG. 5, the method begins, in step 402, by fabricating a multi-layer substrate 210. The substrate 210 is formed from a stack of multiple dielectric layers 301-305 and multiple patterned conductive layers 356-360, which are built up in an alternating arrangement. The substrate 210 is defined by a lower surface 310, an upper surface 312, and sidewalls extending between the lower and upper surfaces 310, 312. For example, the dielectric layers 301-305 may be formed from PCB dielectric materials (e.g., FR-4), ceramic, or other suitable dielectric materials. The patterned conductive layers 356-360 are formed from conductive metals, which are patterned during the build-up process. Also during the build-up process, conductive vias (e.g., vias 315-317, FIG. 3) are formed through the dielectric layers in order to connect various portions of adjacent patterned conductive layers.

Various conductive paths within the substrate 210 (formed from various combinations of conductive layer portions and conductive vias) will provide for interconnections between dies and components, which will later be mounted to the substrate 210. In addition, some of the conductive paths within the substrate may be configured to provide desired inductances and impedance transformations. For example, a conductive path comprising vias 316, 317 and conductive layer portion 318 may form a phase delay and impedance inverter element (e.g., impedance inverter/phase delay element 184, FIG. 1).

It should be noted that, although substrate 210 is shown to include five dielectric layers 301-305 and five conductive layers 356-360, other embodiments of a substrate may include more or fewer dielectric layers and/or conductive layers.

Once completed, the substrate 210 includes substrate contacts 320, which are exposed at the upper surface 312 of the substrate 210. In addition, the substrate includes embedded substrate die contacts 330-333 and embedded interconnect contacts 350, 351 at an internal, surface 311 of the substrate 210.

Figure 6:
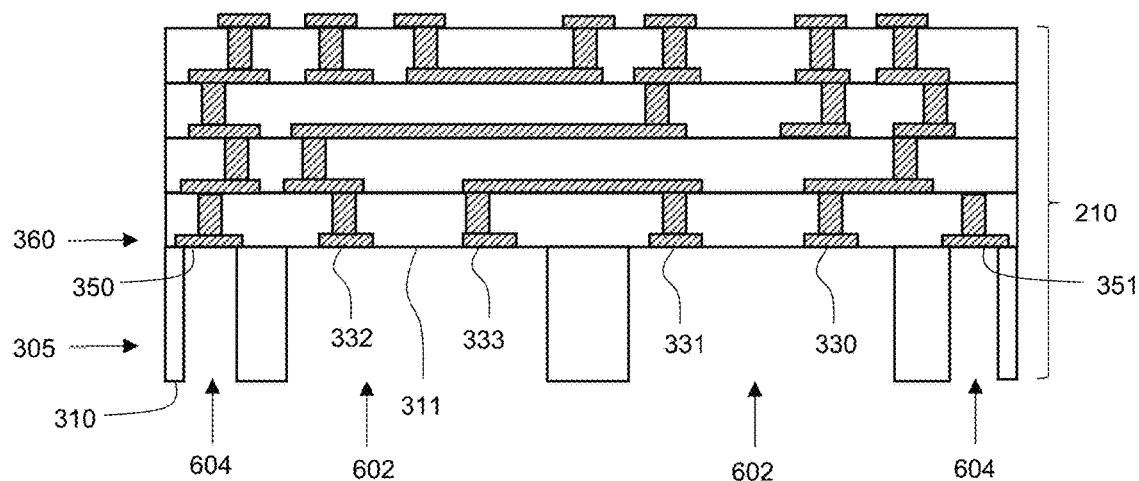

Referring now to FIG. 6, the method continues, in step 404, by creating one or more first die openings 602 through the lower substrate surface 310 to expose substrate die contacts 330-333 at the interior surface 311 of the substrate 210. Additionally, in step 406, second interconnect openings 604 are formed through the lower substrate surface 310 to expose interconnect contacts 350, 351, which also may be located at the interior surface 311. According to an embodiment, the openings 602, 604 may be formed using an etching process, which is timed to stop when the substrate and interconnect contacts 330-333, 350, 351 are reached.

Although FIG. 6 illustrates that two die openings 602 are formed in substrate 210, in alternate embodiments, a single opening may be formed, which will accommodate both power transistor dies 340, 341. In addition, although one embodiment for forming interconnect openings 604 may form a separate opening for each interconnect 240, other embodiments may include forming a larger opening that spans multiple interconnect contacts, and into which multiple interconnects 240 may be inserted.

Figure 7:
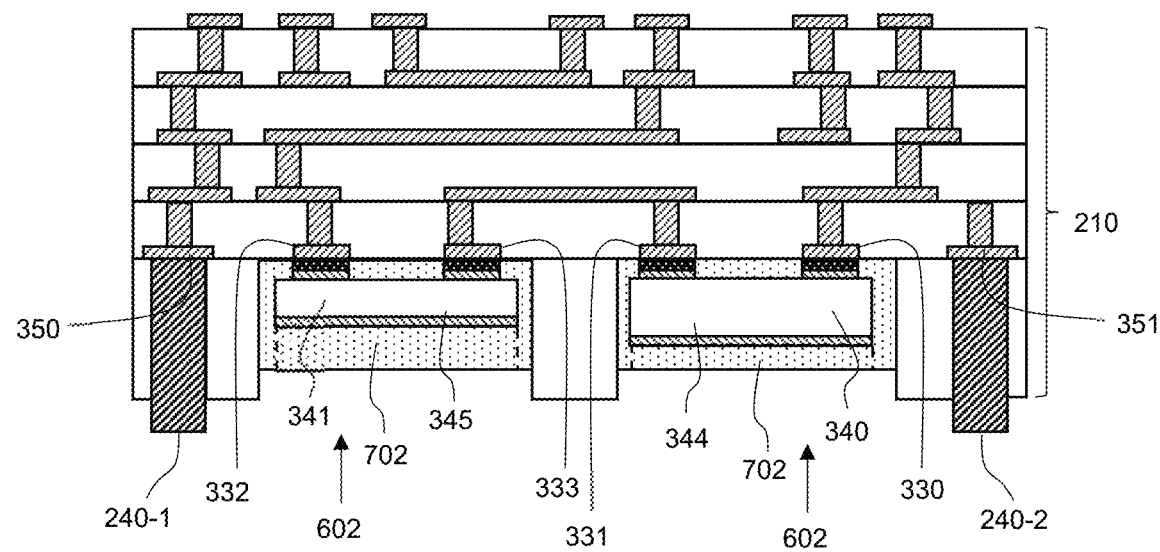

Referring now to FIG. 7, in step 408, conductive interconnects 240 are physically and electrically coupled to the interconnect contacts 350, 351 exposed through the interconnect openings 604. In one embodiment, the conductive interconnects 240 are conductive posts that are inserted into the interconnect openings 604, and then soldered, brazed, or otherwise attached to the interconnect contacts 350, 351. In other embodiments, the conductive interconnects 240 may be formed by filling the interconnect openings 604 with conductive material. In still other embodiments, the interconnects 240 may be portions of a leadframe (not shown). In still other embodiments, multiple interconnects 240 may be packaged side-by-side in one or more separate dielectric interposer structures (not shown), and the dielectric interposer structures may be inserted into larger interconnect openings that span multiple interconnect contacts 350, 351. As shown in FIG. 2B, the interconnect openings and the interconnect contacts 240 may be located adjacent to multiple sides of the device 200 (e.g., to all four sides, as shown, or to less than all four sides).

In step 410, the power transistor dies 340, 341 are "bumped," by applying solder paste to the die bondpads (e.g., to the input and output, or gate and drain, bondpads). The dies are then inserted into the die openings 602. The die bondpads and the solder paste on the die bondpads are brought into contact with corresponding substrate die contacts 330-333. A solder reflow process may then be performed to solder-attach the die bondpads to the substrate die contacts 330-333.

In step 412, gaps between the power transistor dies 340, 341 and sidewalls of the die openings 602 are then filled in with underfill material 702 (e.g., plastic encapsulant material). In some embodiments, the underfill material 702 may be deposited so that it only extends part-way up the sides of the dies 340, 341, leaving the outer surface of the die (e.g., conductive layer 344, 345) exposed. In other embodiments, as indicated in FIG. 7, a sufficient quantity of the underfill material 702 may be deposited in the openings 602 so that the underfill material 702 completely covers the power transistor dies 340, 341. In such an embodiment, portions of the underfill material 702 subsequently may be removed, as indicated by dashed lines in the underfill material 702, to expose the conductive layers 344, 345 on the outward facing surface of the power transistor dies 340, 341. As discussed previously, the conductive layers 344, 345 that define the exposed outer surfaces of the dies 340, 341 may be electrically connected, within each die 340, 341, to a source terminal of a transistor embedded within the die 340, 341.

Figure 8:
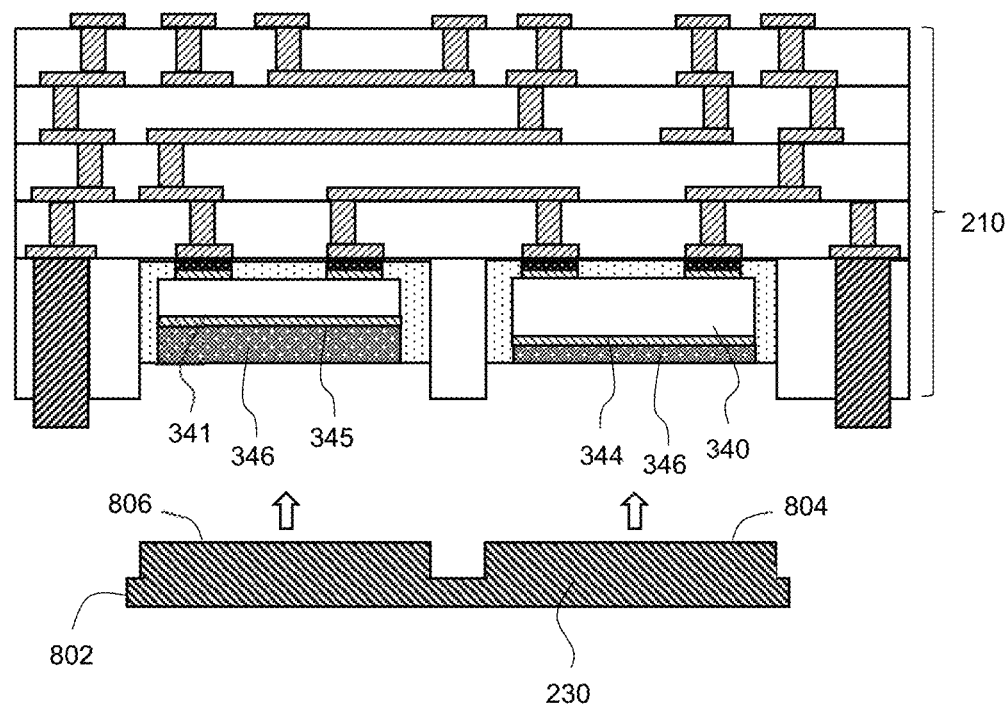
Figure 9:
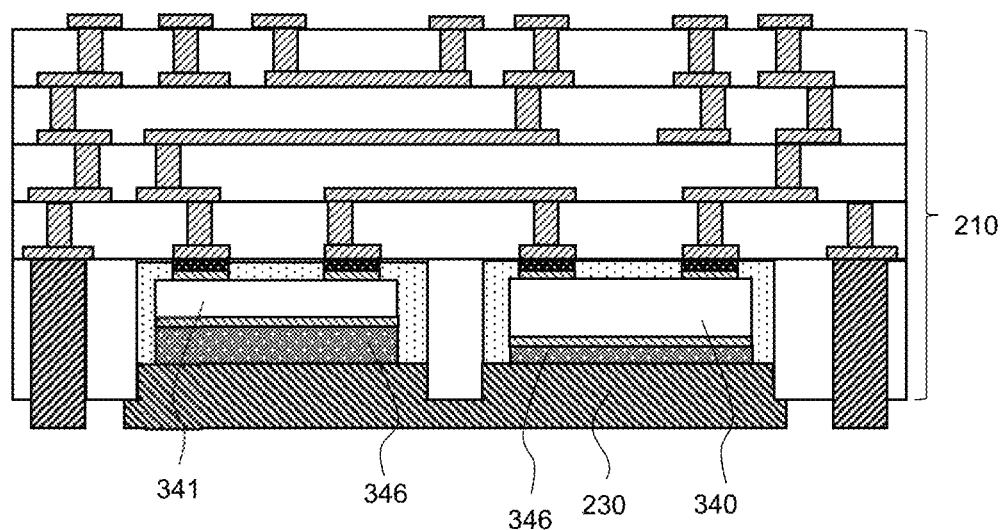

Referring now to FIGS. 8 and 9 and step 414, electrically and thermally conductive die attach material 346 (e.g., solder paste, sinter paste, or other suitable materials) is applied to the outward facing surfaces of the dies 340, 341, and more particularly to the conductive layers 344, 345 of the dies 340, 341. As indicated previously, the thickness of the die attach material 346 over each die 340, 341 may be different to account for differing heights of the dies 340, 341. Alternatively, the thickness of the die attach material 346 over each die 340, 341 may be the same, and height differences may be accommodated by customizing the subsequently attached thermal structure 230.

The thermal structure 230 may be a simple conductive coin, or as illustrated in FIGS. 8 and 9, may have a more complicated configuration. For example, the thermal structure 230 may be a cast or machined piece of thermally conductive material (e.g., metal), which has a base 802 and multiple pedestals 804, 806 that establish equal or differing thicknesses across the thermal structure 230. In the illustrated embodiment, the pedestals 804, 806 have equal heights (vertical dimension in FIGS. 8, 9). In other embodiments, the multiple pedestals 804, 806 may have different heights. This may be desirable, for example, so that equal thickness of die attach material 346 may be deposited on each die 340, 341, and the die height variation may be accommodated by the different-height pedestals.

The thermal structure 230 is then inserted into the die openings 602 and brought into contact with the die attach material 346. The device 200 is then processed (e.g., by performing a reflow or sintering process) to securely connect the thermal structure 230 to the dies 340, 341.

Figure 10:
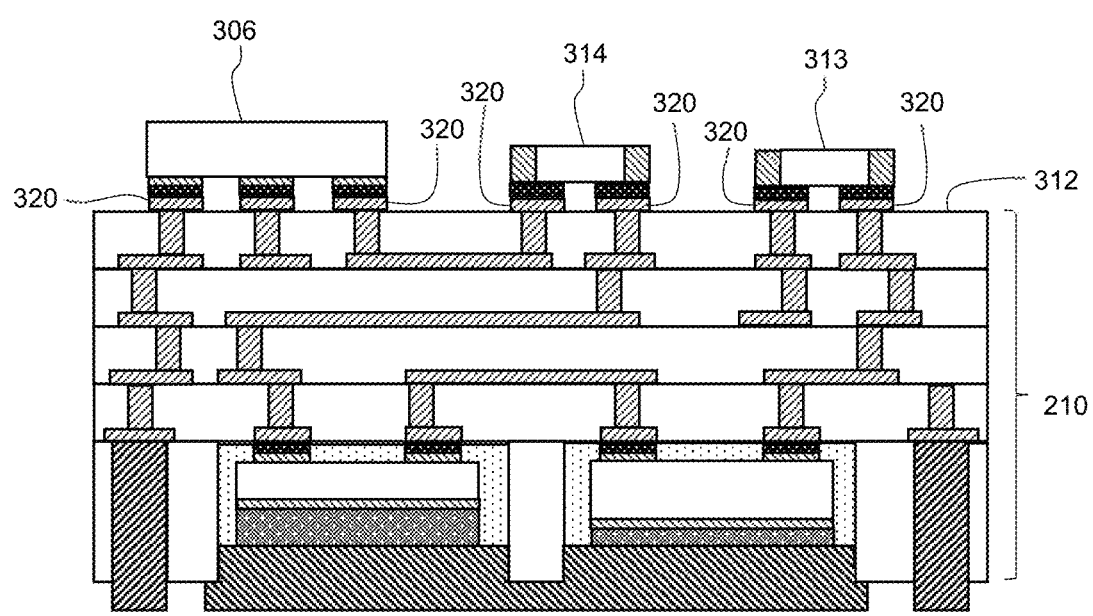

Referring now to FIG. 10 and step 416, the terminals of one or more surface mount components 306, 313, 314 are coupled (e.g., solder-attached) to the additional substrate contacts 320 that are exposed at substrate surface 312. As discussed previously, the surface mount components 306, 313, 314 can correspond to a number of components of an amplifier circuit. For example, surface mount component 306 may correspond to a power divider circuit (e.g., power divider 106, FIG. 1), and surface mount components 313, 314 may correspond to capacitors, inductors, or other circuit elements associated with impedance matching, harmonic termination, and so on. Portions of the patterned conductive layers 356-360 also may correspond to circuit elements associated with the impedance matching and harmonic termination circuits. For example, various conductive traces and vias of layers 356-360 may provide inductances of the impedance matching and harmonic termination circuits. In addition, conductive stubs (e.g., radial stubs) also may be formed from patterned portions of layers 356-360. These conductive stubs can be configured to match a load impedance to the transmission line characteristic impedance. For example, within the conductive layers 356-360, one or more stubs may be positioned along conductive paths at various locations. Each stub may be made capacitive or inductive according to whether the conductive path to which it is coupled presents an inductive or capacitive impedance, respectively.

Referring again to FIG. 3, the device 200 is completed in step 418 by applying an encapsulation material layer 260 (e.g., molding compound) over substrate surface 312 and the surface-mount components 306, 313, 314 coupled to substrate surface 312. The encapsulation material layer 260 defines the upper surface 201 of the device 200, whereas the lower substrate surface 310 and the thermal structure 230 define the lower surface 202 of the device 200.

Figure 11:
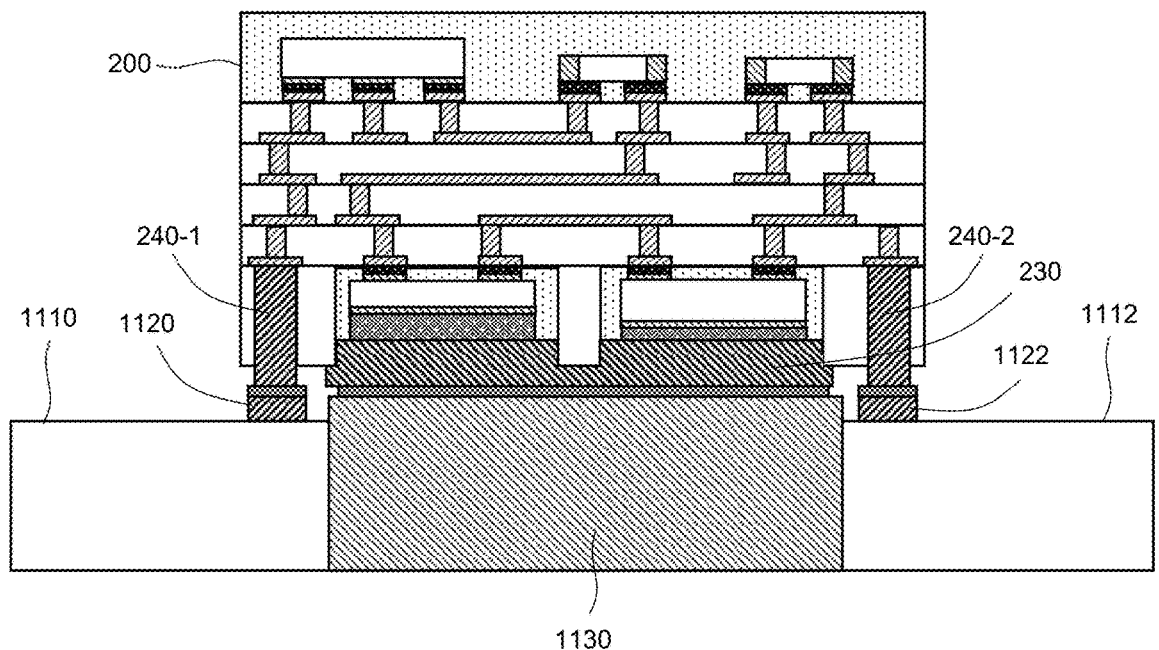
FIG. 11 is a side, cross-sectional view of the power amplifier device of FIG. 3 coupled to a system substrate with bottom-side heat extraction, according to an example embodiment.

The power amplifier device 200 may then be incorporated into a larger system (e.g., a transmitter and/or communication system). For example, FIG. 11 is side, cross-sectional view of the power amplifier device 200 of FIG. 3 coupled to a system substrate 1110, according to an example embodiment. The system substrate 1110 may be, for example, a PCB with a plurality of contact pads 1120, 1122 at a top surface 1112. Although not shown in FIG. 11, the contact pads 1120, 1122 may be electrically coupled through additional traces on the substrate 1110 to other system components. According to an embodiment, a heat sink or heat extraction component 1130 (e.g., a conductive coin, thermal vias, or other thermally conductive component) is embedded within the system substrate 1110, and has an exposed upper surface proximate the top surface 1112 of the system substrate 1110.

Device 200 is physically and electrically coupled to the system substrate 1110. More particularly, and according to an embodiment, the thermal structure 230 of device 200 is physically, electrically, and thermally coupled to the heat extraction component 1130 of the system substrate 1110. For example, thermal structure 230 and heat extraction component 1130 may be coupled together using thermal grease, solder, sinter material, or brazing. Besides providing a pathway for extraction of heat, the heat extraction component 1130 also may be coupled to system ground, and thus the heat extraction component 1130 may serve as a system ground connection for device 200.

In addition, the conductive interconnects 240-1, 240-2 (and other interconnects 240) are physically and electrically coupled (e.g., soldered) to the contact pads 1120, 1122 at the top surface 1112 of the system substrate 1110. Accordingly, the system substrate 1110 enables RF input signals to be provided to device 200 (e.g., through contact pad 1120), RF output signals to be received from device 200 (e.g., through contact pad 1122), and additional bias and ground connections to be established between the system substrate 1110 and the device 200 through other substrate contact pads and device interconnects (not shown).

The embodiment of device 200 depicted in FIGS. 3 and 11 provides for bottom-side cooling of device 200. In a bottom-side cooled system, such as that depicted in FIG. 11, the heat extraction path for the dies 340, 341 within device 200 extends through the system substrate 1110.

If device 200 were slightly modified, it could instead be incorporated into a top-side cooled system. For example, FIG. 12 is a side, cross-sectional view of another embodiment of a power amplifier device 200' coupled to a system substrate 1210 in a system with top-side heat extraction, according to an example embodiment.

Figure 12:
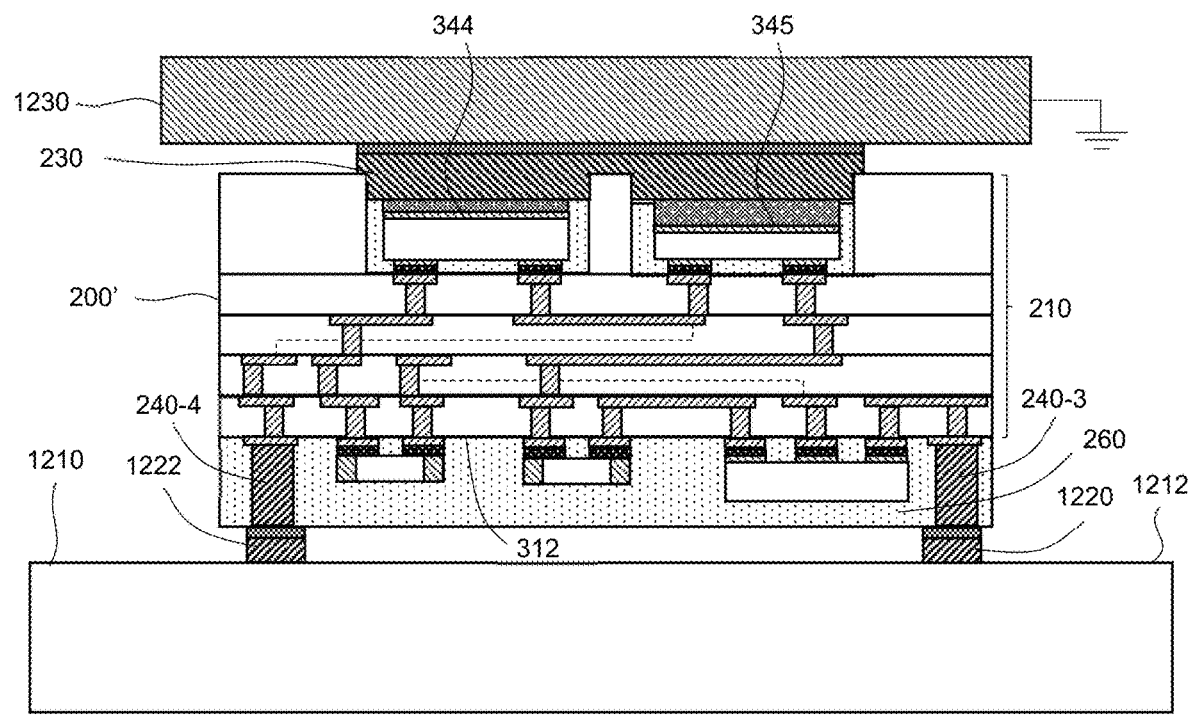
FIG. 12 is a side, cross-sectional view of another embodiment of a power amplifier device coupled to a system substrate with top-side heat extraction, according to an example embodiment.

Device 200' shown in FIG. 12 is slightly different from device 200 in FIGS. 3 and 11 to facilitate incorporation into a top-side cooled system. In particular, and referring to FIG. 3, device 200 includes conductive interconnects 240-1, 240-2 that extend through though a layer 305 located at the lower surface 310 of the device substrate 210. Thus, the conductive interconnects 240-1, 240-2 and the thermal structure 230 both are exposed at the lower surface 310 of the device 200.

In contrast, and referring to FIG. 12, in modified power amplifier device 200', conductive interconnects 240-3, 240-4, which function as I/O terminals for the device 200', instead are coupled to surface 312 of device substrate 210, and the interconnects 240-3, 240-4 extend through the encapsulation material layer 260 at the opposite surface of the device 200' from the dies 340, 341 and the thermal structure 230. Additional conductive interconnects (not shown) for bias and ground connection also would extend through the encapsulation material layer 260. In other words, in device 200', the conductive interconnects 240-3, 240-4 are exposed at an opposite surface of device 200' than the surface at which the thermal structure 230 is exposed. The conductive interconnects 240-3, 240-4 are electrically coupled through the device substrate to the various dies 340, 341 and surface mount components 306, 313, 314 as discussed above in conjunction with FIG. 3.

Again, the system substrate 1210 may be, for example, a PCB with a plurality of contact pads 1220, 1222 at a top surface 1212. Although not shown in FIG. 12, the contact pads 1220, 1222 may be electrically coupled through additional traces on the substrate 1210 to other system components.

Device 200' is physically and electrically coupled to the system substrate 1210. More particularly, and according to an embodiment, the conductive interconnects 240-3, 240-4 (and other interconnect, not shown) are physically and electrically coupled (e.g., soldered) to the contact pads 1220, 1222 at the top surface 1212 of the system substrate 1210. Accordingly, the system substrate 1210 enables RF input signals to be provided to device 200' (e.g., through contact pad 1220), RF output signals to be received from device 200' (e.g., through contact pad 1222), and additional bias and ground connections to be established between the system substrate 1210 and the device 200' through other substrate contact pads and device interconnects (not shown).

In the orientation shown in FIG. 12, the thermal structure 230 of device 200' is facing upward away from the system substrate 1210. According to an embodiment, a heat extraction component 1230 (e.g., a heat sink or conductive plate) is physically, electrically, and thermally coupled to the thermal structure 230 of device 200'. For example, thermal structure 230 and heat extraction component 1230 may be coupled together using thermal grease, solder, sinter material, or brazing. Besides providing a pathway for extraction of heat, the heat extraction component 1230 also may be coupled to system ground, and thus the heat extraction component 1230 may serve as a system ground connection for device 200'. In other embodiments, to ensure adequate RF grounding, other grounding structures may be implemented within device 200' (e.g., by providing a conductive pathway through the substrate 210 between conductive layers 344, 345 and a device terminal 240 coupled to system ground), or on the exterior surface of device 200' (e.g., by providing a conductive pathway extending along the sides of substrate 210 and layer 260 that electrically couples layers 344, 345 to a ground contact on the system substrate 1210).

Various modifications may be made to the power transistor devices 200, 200' while maintaining their function and unique aspects. For example, as will be discussed in conjunction with FIG. 13, rather than inserting the power transistor dies 340, 341 into openings in a substrate (e.g., openings 602 in substrate 210, FIG. 6), the power transistor dies 340, 341 instead could be coupled to a substrate surface and encapsulated.

Figure 13:
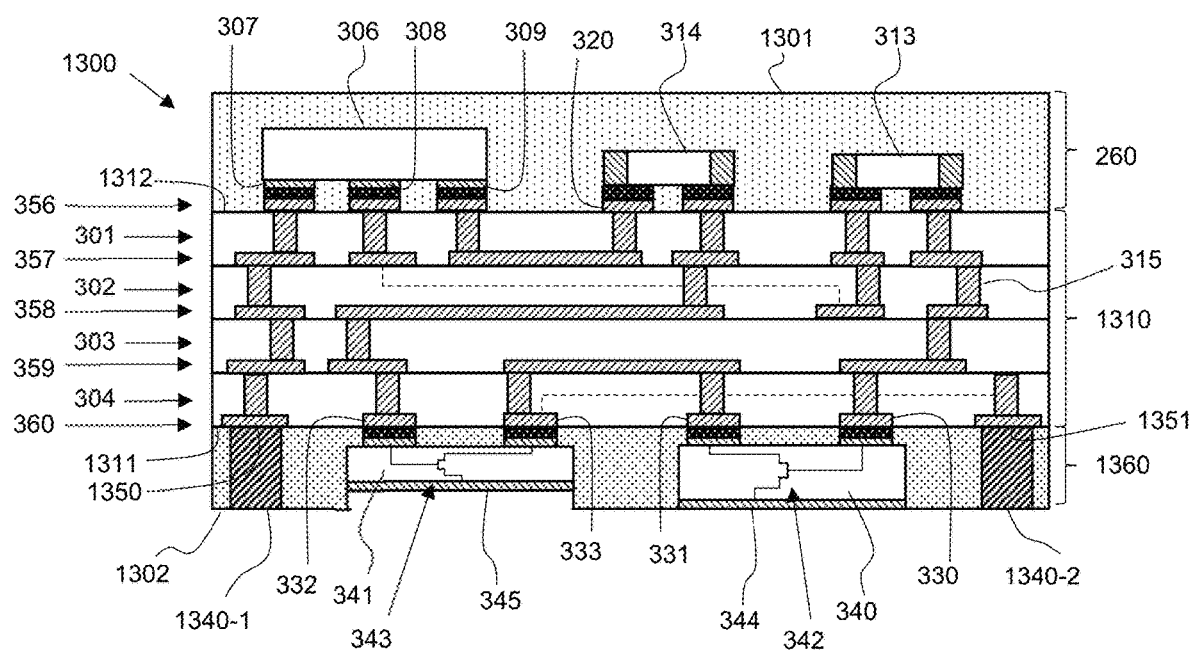
FIG. 13 is a side, cross-sectional view of yet another embodiment of a power amplifier device, according to another example embodiment.

Such an embodiment is shown in FIG. 13, which is a side, cross-sectional view of another example embodiment of a power amplifier device 1300. Power amplifier device 1300 is similar in many respects to power amplifier devices 200, 200' (FIGS. 3, 12), discussed above. Where elements in power amplifier device 1300 are substantially identical to elements in power amplifier devices 200, 200', the same reference numbers will be used, and all details discussed above with respect to such elements apply equally to the same-numbered elements in FIG. 13. For purpose of brevity, all details will not be repeated here.

For power amplifier device 1300, the device body includes first and second encapsulation material layers 260, 1360 connected to opposite surfaces 1312, 1311 of a substrate 1310. The substrate 1310 is formed from a stack of multiple dielectric layers 301-304 and multiple patterned conductive layers 356-360 in an alternating arrangement. A plurality of conductive vias (e.g., via 315) electrically connect the patterned conductive layers 356-360. Substrate die contacts 330-333 and interconnect contacts 350, 351 are exposed at a first surface 1311 of the substrate 1310, and additional substrate contacts 320 are exposed at a second surface 1312 of the substrate 1310.

According to an embodiment, one or more surface mount components 306, 313, 314 are connected to the additional substrate contacts 320 that are exposed at the second surface 1312 of the substrate 1310. A first encapsulation material layer 260 covers the surface mount components 306, 313, 314 and the second substrate surface 1312. The first encapsulation material layer 260 essentially defines the upper device surface 1301.

The surface mount components 306, 313, 314 can correspond to a number of components of an amplifier circuit. For example, at least one surface mount component 306 may correspond to a power divider circuit (e.g., power divider 106, FIG. 1), and additional surface mount components 313, 314 may correspond to portions of input impedance matching circuits (e.g., circuits 113, 114, FIG. 1) and/or harmonic termination circuits (e.g., circuits 116, 118, FIG. 1).

According to an embodiment, first and second power transistor dies 340, 341 are connected to the substrate die contacts 330-333, and thus are connected to the first substrate surface 1311. The first power transistor die 340 includes at least one integrated transistor 342, and the second power transistor die 341 includes at least one additional integrated transistor 343. Each power transistor includes a gate terminal, a drain terminal, and a source terminal. As can be seen in the cross-section of device 1300, the gate and drain terminals of each transistor 342, 343 are coupled to gate and drain contacts (not numbered) that are exposed at first die surfaces of the dies 340, 341. The gate and drain contacts, in turn, are coupled to (e.g., soldered to) the substrate die contacts 330-333. The source terminal of each transistor 342, 343 is coupled to a conductive bottom layer 344, 345 of each die 340, 341, and the conductive bottom layer 344, 345 defines a second die surface of each die 340, 341.

In addition to the power transistor dies 340, 341, the proximal ends of a plurality of conductive interconnects 1340-1, 1340-2 (e.g., analogous to interconnects 240, FIG. 2) are coupled to interconnect contacts 350, 351 at the first surface 1311 of the substrate. Similar to the conductive interconnects 240-1, 240-2 of FIG. 3, the conductive interconnects 1340-1, 1340-2 of the power transistor device 1300 are configured to convey RF signals, bias voltages, and ground connections to the amplifier circuitry (e.g., dies 340, 341 and surface mount components 306, 313, 314) embedded within the device 1300. In FIG. 13, conductive interconnect 1340-1 more specifically corresponds to an RF input terminal (e.g., terminal 102, FIG. 1), and conductive interconnect 1340-2 more specifically corresponds to an RF output terminal (e.g., terminal 104, FIG. 1).

In contrast with device 200 of FIG. 3, in which dies 340, 341 and interconnects 240-1, 240-2 are inserted into openings 602 in a substrate layer 305 (FIGS. 3, 6), power transistor device 1300 includes a second encapsulation material layer 1360 that covers the first surface 1311, sidewalls of the power transistor dies 340, 341 and sidewalls of the conductive interconnects 1340-1, 1340-2. The second encapsulation material layer 1360 essentially defines the lower device surface 1302. According to an embodiment, the conductive layers 344, 345 of the power transistor dies 340, 341 are exposed at the lower device surface 1302, as are the distal ends of the conductive interconnects 1340-1, 1340-2.

When an input RF signal is provided to interconnect 1340-1, the input RF signal may be conveyed through the substrate 1310 to the input terminal of the power divider circuit 306, and the power divider circuit 306 may perform the function of splitting the input RF signal into multiple (e.g., two or more) separate signals (e.g., a carrier signal and a peaking signal). The separate signals provided at the power divider outputs may then be conveyed through the substrate 1310 to the impedance matching components 313, 314 or directly to the inputs of the power transistor dies 340, 341.

Although not shown in the cross-section of FIG. 13, other conductive interconnects may be used to receive bias voltages, which may be conducted from the interconnects to the power transistor dies 340, 341 through the patterned conductive layers 356-360 and conductive vias of the substrate 1310. In addition, other conductive interconnects may be used to provide a ground reference (e.g., they may be coupled to ground when device 1300 is incorporated into a larger system). The ground connection between the ground interconnects and other circuit components (e.g., some of surface mount devices 306, 313, 314) may be made through the patterned conductive layers 356-360 and conductive vias of the substrate 1310.

Figure 14:
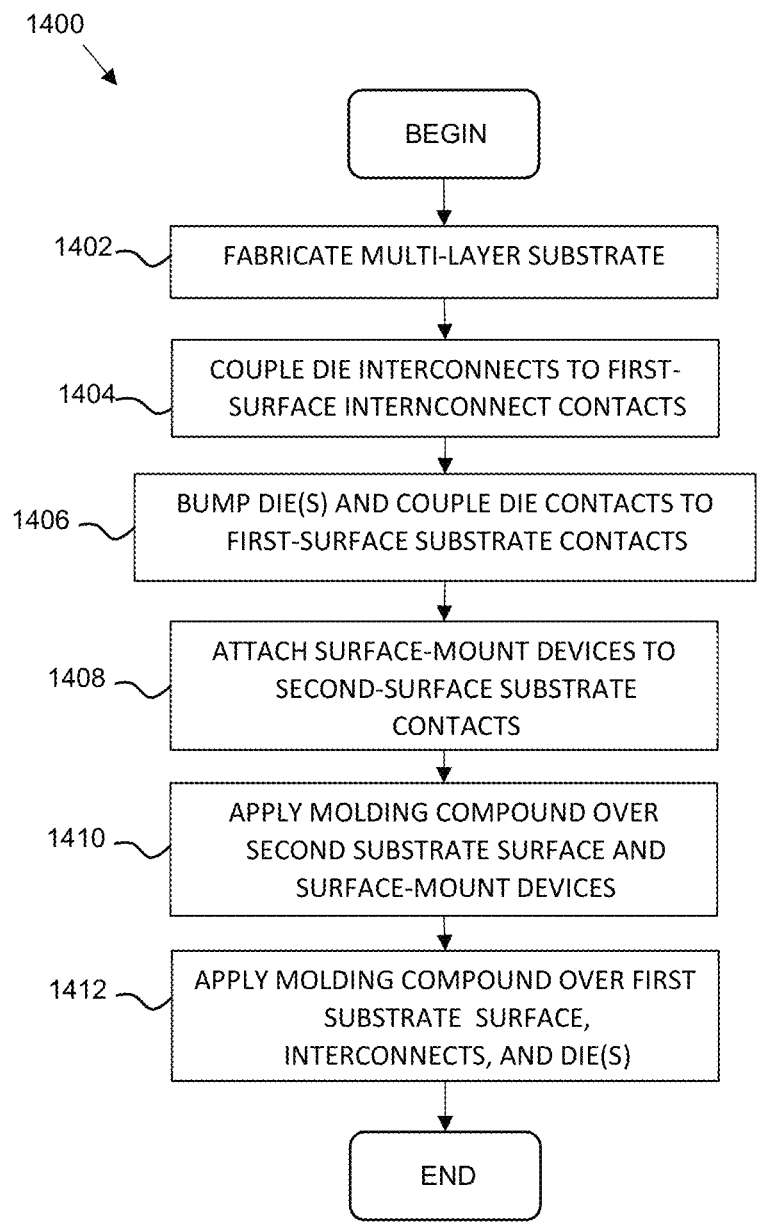
FIG. 14 is a flowchart of a method of manufacturing the power amplifier device of FIG. 13, according to an example embodiment.

FIG. 14 is a flowchart of a method 1400 of manufacturing the power amplifier device 1300 of FIG. 13, according to an example embodiment. For enhanced understanding, FIG. 14 should be viewed simultaneously with FIGS. 15 and 16, which are side, cross-sectional views of the power amplifier device 1300 of FIG. 13 at various stages of manufacture, according to an embodiment.

Figure 15:
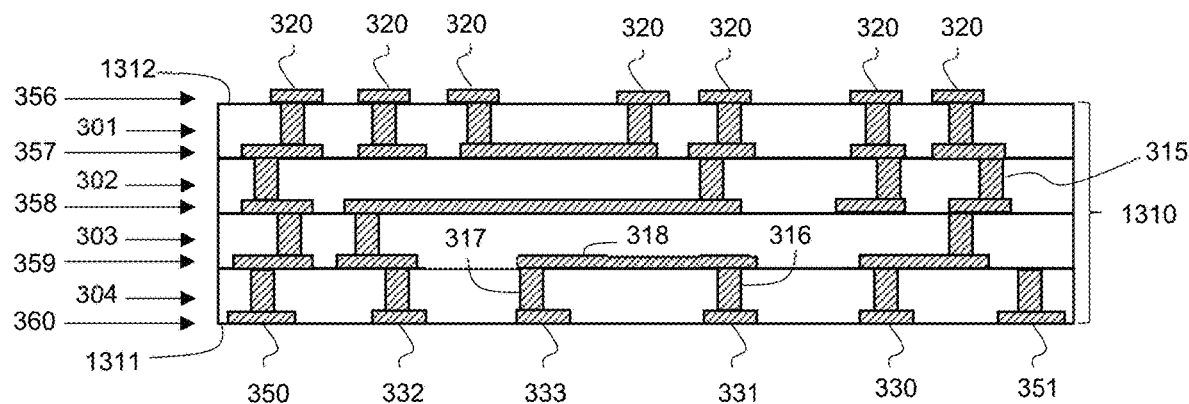
FIGS. 15-16 are side, cross-sectional views of the power amplifier device of FIG. 13 at various stages of manufacture, according to an embodiment.

Referring also to FIG. 15, the method begins, in step 1402, by fabricating a multi-layer substrate 1310. The substrate 1310 is formed from a stack of multiple dielectric layers 301-304 and multiple patterned conductive layers 356-360, which are built up in an alternating arrangement. The substrate 1310 is defined by a lower surface 1311, an upper surface 1312, and sidewalls extending between the lower and upper surfaces 1311, 1312. For example, the dielectric layers 301-304 may be formed from PCB dielectric materials (e.g., FR-4), ceramic, or other suitable dielectric materials. The patterned conductive layers 356-360 are formed from conductive metals, which are patterned during the build-up process. Also during the build-up process, conductive vias (e.g., vias 315-317) are formed through the dielectric layers in order to connect various portions of adjacent patterned conductive layers.

Various conductive paths within the substrate 1310 (formed from various combinations of conductive layer portions and conductive vias) will provide for interconnections between dies and components, which will later be mounted to the substrate 1310. In addition, some of the conductive paths within the substrate may be configured to provide desired inductances and impedance transformations. For example, a conductive path comprising vias 316, 317 and conductive layer portion 318 may form a phase delay and impedance inverter element (e.g., impedance inverter/phase delay element 184, FIG. 1).

It should be noted that, although substrate 1310 is shown to include four dielectric layers 301-304 and five conductive layers 356-360, other embodiments of a substrate may include more or fewer dielectric layers and/or conductive layers.

Once completed, the substrate 1310 includes substrate contacts 320, which are exposed at the upper surface 1312 of the substrate 1310. In addition, the substrate includes substrate die contacts 330-333 and interconnect contacts 350, 351 exposed at the lower surface 1311 of the substrate 1310.

Figure 16:
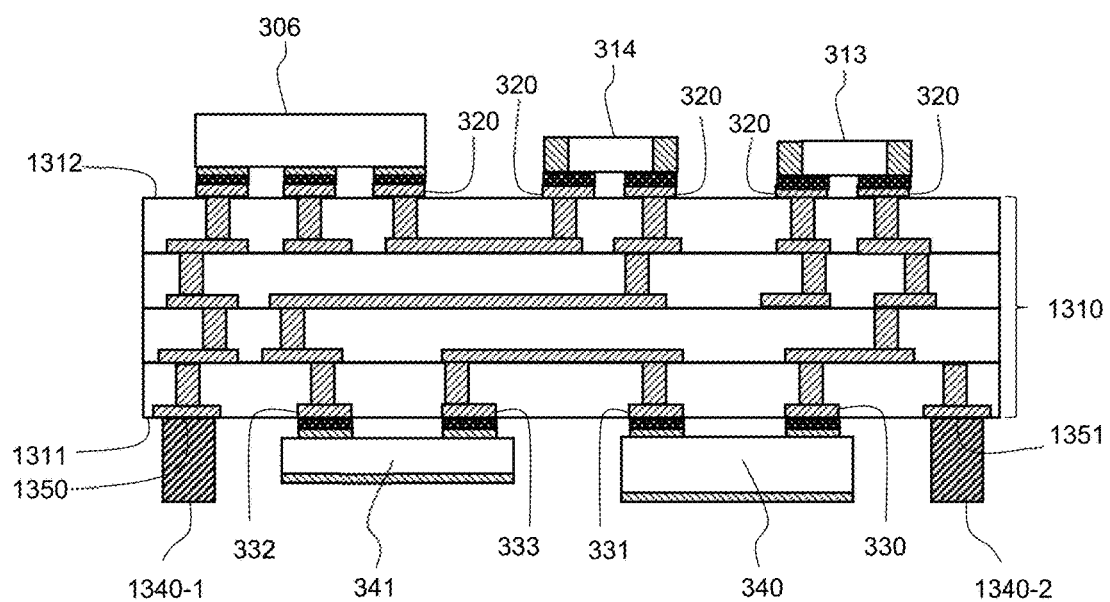

Referring now to FIG. 16, in step 1404, conductive interconnects 1340-1, 1340-2 (along with additional interconnects associated with bias, ground, and so on) are physically and electrically coupled to the interconnect contacts 350, 351 exposed at the lower surface 1311 of the substrate 1310. In one embodiment, the interconnect contacts 1340-1, 1340-2 are conductive posts that are soldered, brazed, or otherwise attached to the interconnect contacts 350, 351. In other embodiments, the interconnect contacts 1340-1, 1340-2 may be portions of a leadframe (not shown). In still other embodiments, multiple interconnects may be packaged side-by-side in one or more separate dielectric interposer structures (not shown), and the dielectric interposer structures may be coupled to the interconnect contacts 350, 351.

In step 1406, the power transistor dies 240, 241 are "bumped," by applying solder paste to the die bondpads (e.g., to the input and output, or gate and drain, bondpads). The die bondpads and the solder paste on the die bondpads are brought into contact with corresponding substrate die contacts 330-333. A solder reflow process may then be performed to solder-attach the die bondpads to the substrate die contacts 330-333.

In step 1408, the terminals of one or more surface mount components 306, 313, 314 are coupled (e.g., solder-attached) to the additional substrate contacts 320 that are exposed at substrate surface 1312. As discussed previously, the surface mount components 306, 313, 314 can correspond to a number of components of an amplifier circuit. For example, surface mount component 306 may correspond to a power divider circuit (e.g., power divider 106, FIG. 1), and surface mount components 313, 314 may correspond to capacitors, inductors, or other circuit elements associated with impedance matching, harmonic termination, and so on.

In step 1410, and referring again to FIG. 13, an encapsulation material layer 260 (e.g., molding compound) is applied over substrate surface 1312 and the surface-mount components 306, 313, 314 coupled to substrate surface 1312. The encapsulation material layer 260 defines the upper surface 1301 of the device 1300.

Finally, the device is completed, in step 1412, by applying another encapsulation material layer 1360 (e.g., molding compound) over substrate surface 1311, dies 340, 341, and interconnects 1340-1, 1340-2, according to an embodiment. The encapsulation material layer 1360 defines the lower surface 1302 of the device 1300. Desirably, once completed, the distal ends of interconnects 1340-1, 1340-2 and the conductive bottom layers 344, 345 of the dies 340, 341 are exposed at the lower surface 1302 of the device 1300. As discussed previously, the conductive layers 344, 345 that define the exposed outer surfaces of the dies 340, 341 may be electrically connected, within each die 340, 341, to a source terminal of a transistor embedded within the die 340, 341.

Figure 17:
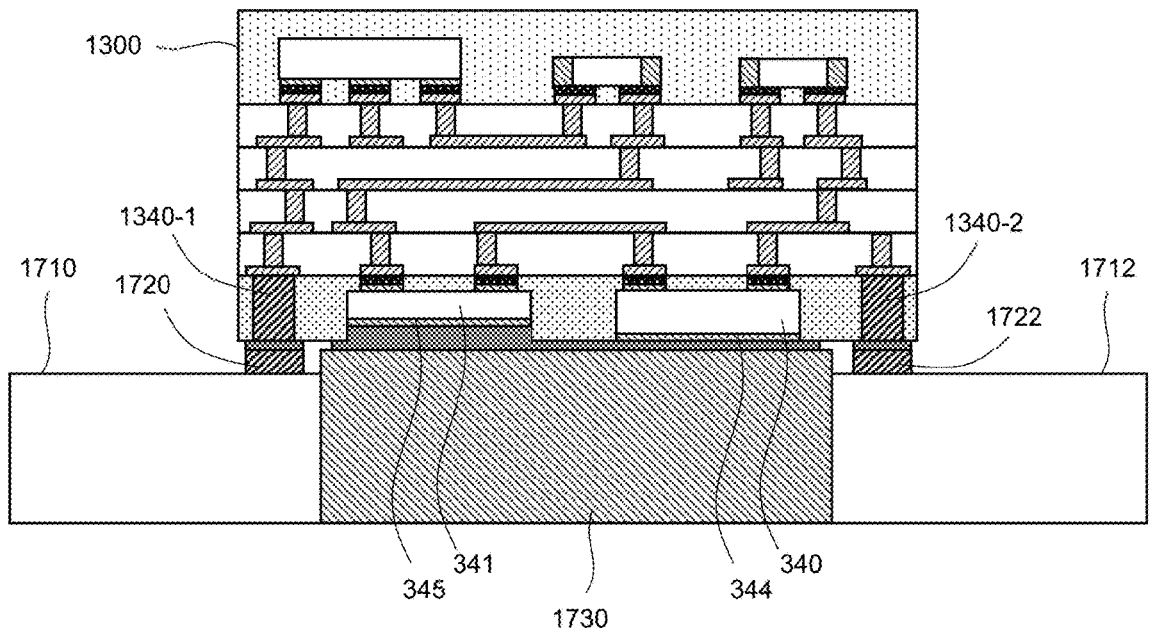
FIG. 17 is a side, cross-sectional view of the power amplifier device of FIG. 13 coupled to a system substrate with bottom-side heat extraction, according to an example embodiment.

The power amplifier device 1300 may then be incorporated into a larger system (e.g., a transmitter and/or communication system). For example, FIG. 17 is a side, cross-sectional view of the power amplifier device 1300 of FIG. 13 coupled to a system substrate 1710, according to an example embodiment. The system substrate 1710 may be, for example, a PCB with a plurality of contact pads 1720, 1722 at a top surface 1712. Although not shown in FIG. 17, the contact pads 1720, 1722 may be electrically coupled through additional traces on the substrate 1710 to other system components. According to an embodiment, a heat sink or heat extraction component 1730 (e.g., a conductive coin, thermal vias, or other thermally conductive component) is embedded within the system substrate 1710, and has an exposed upper surface proximate the top surface 1712 of the system substrate 1710.

Device 1300 is physically and electrically coupled to the system substrate 1710. More particularly, and according to an embodiment, the conductive surfaces 344, 345 of dies 340, 341 are physically, electrically, and thermally coupled to the heat extraction component 1730 of the system substrate 1710. For example, dies 340, 341 and heat extraction component 1730 may be coupled together using thermal grease, solder, sinter material, or brazing. Besides providing a pathway for extraction of heat, the heat extraction component 1730 also may be coupled to system ground, and thus the heat extraction component 1730 may serve as a system ground connection for device 1300.

In addition, the conductive interconnects 1340-1, 1340-2 (and other interconnects, not shown) are physically and electrically coupled (e.g., soldered) to the contact pads 1720, 1722 at the top surface 1712 of the system substrate 1710. Accordingly, the system substrate 1710 enables RF input signals to be provided to device 1300 (e.g., through contact pad 1720), RF output signals to be received from device 1300 (e.g., through contact pad 1722), and additional bias and ground connections to be established between the system substrate 1710 and the device 1300 through other substrate contact pads and device interconnects (not shown).

The embodiment of device 1300 depicted in FIGS. 13 and 17 provides for bottom-side cooling of device 1300. In a bottom-side cooled system, such as that depicted in FIG. 17, the heat extraction path for the dies 340, 341 within device 1300 extends through the system substrate 1710.

If device 1300 were slightly modified, it could instead be incorporated into a top-side cooled system. For example, FIG. 18 is a side, cross-sectional view of another embodiment of a power amplifier device 1300' coupled to a system substrate 1810 in a system with top-side heat extraction, according to an example embodiment.

Figure 18:
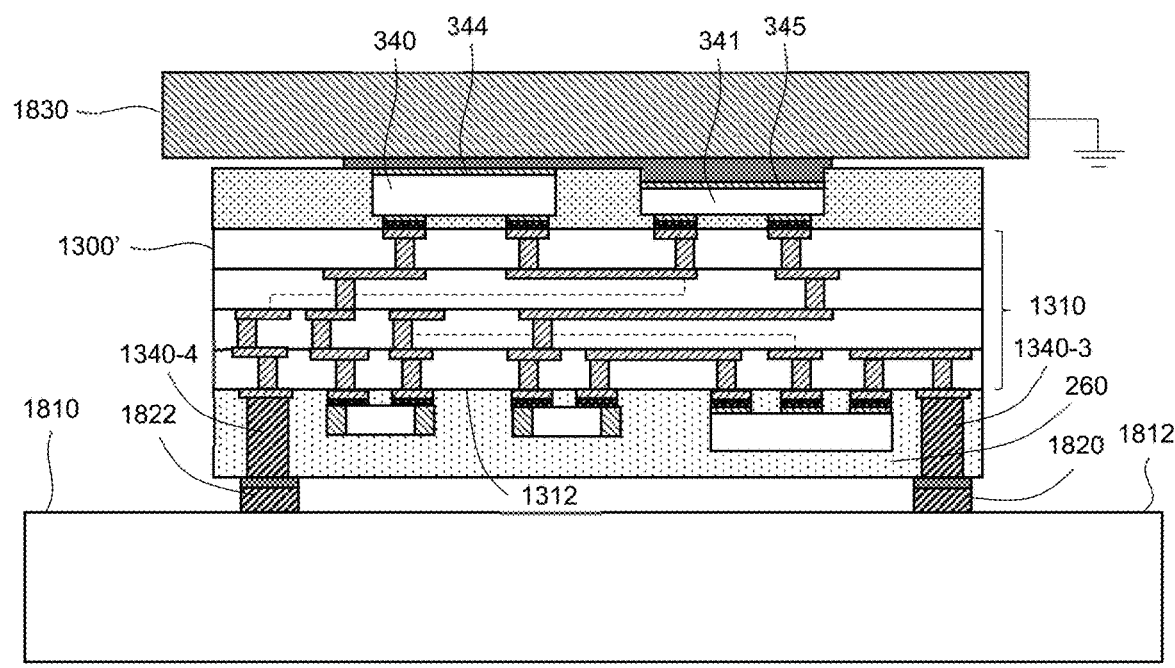
FIG. 18 is a side, cross-sectional view of another embodiment of a power amplifier device coupled to a system substrate with top-side heat extraction, according to an example embodiment.

Device 1300' shown in FIG. 18 is slightly different from device 1300 in FIGS. 13 and 17 to facilitate incorporation into a top-side cooled system. In particular, and referring to FIG. 13, device 1300 includes conductive interconnects 1340-1, 1340-2 coupled to contacts 1350, 1351 at surface 1311 of the device substrate 1310. Thus, the conductive interconnects 1340-1, 1340-2 and the conductive layers 344, 345 of the dies 340, 341 all are exposed at the lower surface 1302 of the device 1300.

In contrast, and referring to FIG. 18, in modified power amplifier device 1300', conductive interconnects 1340-3, 1340-4, which function as I/O terminals for the device 1300', instead are coupled to surface 1312 of device substrate 1310, and the interconnects 1340-3, 1340-4 extend through the encapsulation material layer 260 at the opposite surface of the device 1300' from the dies 340, 341. Additional conductive interconnects (not shown) for bias and ground connection also would extend through the encapsulation material layer 260. In other words, in device 1300', the conductive interconnects 1340-3, 1340-4 are exposed at an opposite surface of device 1300' than the surface at which the dies 340, 341 are exposed. The conductive interconnects 1340-3, 1340-4 are electrically coupled through the device substrate to the various dies 340, 341 and surface mount components 306, 313, 314 as discussed above in conjunction with FIG. 13.

Again, the system substrate 1810 may be, for example, a PCB with a plurality of contact pads 1820, 1822 at a top surface 1812. Although not shown in FIG. 18, the contact pads 1820, 1822 may be electrically coupled through additional traces on the substrate 1810 to other system components.

Device 1300' is physically and electrically coupled to the system substrate 1810. More particularly, and according to an embodiment, the conductive interconnects 1340-3, 1340-4 (and other interconnect, not shown) are physically and electrically coupled (e.g., soldered) to the contact pads 1820, 1822 at the top surface 1812 of the system substrate 1810. Accordingly, the system substrate 1810 enables RF input signals to be provided to device 1300' (e.g., through contact pad 1820), RF output signals to be received from device 1300' (e.g., through contact pad 1822), and additional bias and ground connections to be established between the system substrate 1810 and the device 1300' through other substrate contact pads and device interconnects (not shown).

In the orientation shown in FIG. 18, the conductive layers 344, 345 of dies 340, 341 are facing upward away from the system substrate 1310. According to an embodiment, a heat extraction component 1830 (e.g., a heat sink or conductive plate) is physically, electrically, and thermally coupled to the conductive layers 344, 345 of dies 340, 341. For example, conductive layer 344, 345 and heat extraction component 1830 may be coupled together using thermal grease, solder, sinter material, or brazing. Besides providing a pathway for extraction of heat, the heat extraction component 1830 also may be coupled to system ground, and thus the heat extraction component 1830 may serve as a system ground connection for device 1300'. In other embodiments, to ensure adequate RF grounding, other grounding structures may be implemented within device 1300' (e.g., by providing a conductive pathway through the substrate 1310 between conductive layers 344, 345 and a device terminal coupled to system ground), or on the exterior surface of device 1300' (e.g., by providing a conductive pathway extending along the sides of substrate 1310 and layer 260 that electrically couples layers 344, 345 to a ground contact on the system substrate 1810).

The above-described embodiments of power amplifier devices 200, 200', 1300, 1300' each have I/O and other terminals (e.g., conductive interconnects 240, 240-1, 240-2, 240-3, 240-4, 1340-1, 1340-2, 1340-3, 1340-4) that are exposed at an upper or lower surface of the device. In some cases, it may be desirable to have I/O and other terminals that extend from the side of a device, so that a lower portion of the device may be nested into an opening in a system substrate (e.g., a system PCB). Nesting a device in a system substrate in this manner enables bottom-side cooling easily to be implemented.

Figure 19:
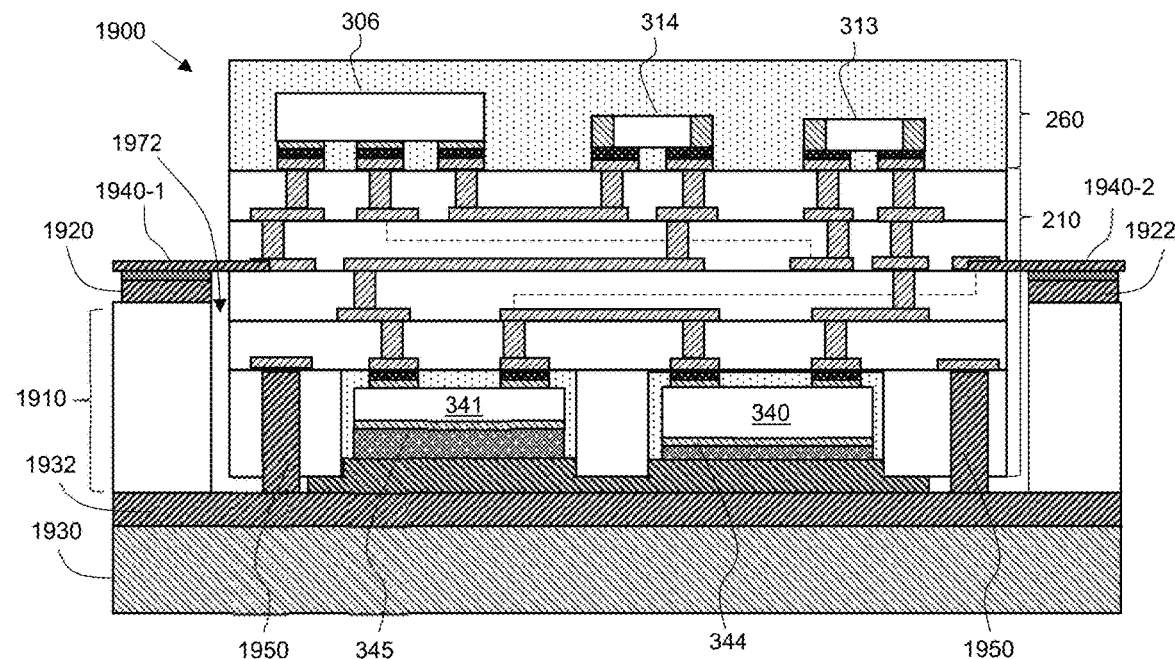
FIG. 19 is a side, cross-sectional view of yet another embodiment of a power amplifier device with side terminals, according to an example embodiment.

FIG. 19 is side, cross-sectional view of yet another embodiment of a power amplifier device 1900 with side terminals 1940-1, 1940-2 coupled to a system substrate 1910, according to an example embodiment. Power amplifier device 1900 is similar in many respects to power amplifier device 200 (FIG. 3), discussed above, except that various terminals of device 1900 extend from the sides of the device, rather than being exposed at the lower surface of the device. Where elements in power amplifier device 1900 are substantially identical to elements in power amplifier device 200, the same reference numbers will be used, and all details discussed above with respect to such elements apply equally to the same-numbered elements in FIG. 19. For purpose of brevity, all details will not be repeated here.

Portions of power amplifier device 1900 that are substantially the same as corresponding portions of power amplifier device 200 include device substrate 210, power transistor dies 340, 341 that are embedded in openings (e.g., openings 602, FIG. 6) in the device substrate 210, and surface mount components 306, 313, 314 that are embedded in encapsulant material layer 260.

Device 1900 also may include optional interconnects 1950, which also are embedded in the same side of the device 1900 as the dies 340, 341. These interconnects 1950 are similar to interconnects 240, 240-1, 240-2 (FIGS. 2, 3), in that they are electrically connected through the patterned conductive layers and vias of the substrate 210 to various components and circuits embedded in device 1900. However, unlike interconnects 240, 240-1, 240-2, which function as I/O, ground, and bias terminals, interconnects 1950 only provide for ground connections for the various components and circuits embedded within the device 1900.

In order to provide I/O and bias connections, device 1900 includes a plurality of side leads (e.g., leads 1940-1, 1940-2), which extend perpendicularly from the sides of device 1900, and more particularly from the sides of device substrate 210. The leads 1940-1, 1940-2 are electrically coupled through the patterned conductive layers and vias of the device substrate 210 to the various dies 340, 341 and surface mount components 306, 313, 314.

According to an embodiment, each of the leads 1940-1, 1940-2 electrically connects to at least one conductive portion of one of the embedded conductive layers (e.g., any of layers 357-359, FIG. 3) of the device substrate 210. At least one lead (e.g., lead 1940-1) corresponds to the RF input for the amplifier device 1900 (e.g., input 102, FIG. 1), and at least one other lead (e.g., lead 1940-2) corresponds to the RF output for the amplifier device 1900 (e.g., output 104, FIG. 1). As shown in FIG. 19, for example, lead 1940-1 is electrically coupled through the patterned conductive layers and vias to surface mount device 306 (e.g., to the input terminal of a splitter), and lead 1940-2 is electrically coupled through the patterned conductive layers and vias (as indicated with a dashed line) to the drain terminal of power transistor die 341. As discussed above, the drain terminal of power transistor die 341 may correspond to the combining node of a Doherty amplifier, and thus lead 1940-2 is electrically coupled to the combining node.

To incorporate the device 1900 into a larger system, a lower half of the device 1900 is inserted into an opening 1972 in a system substrate 1910. Again, the system substrate 1910 may be, for example, a PCB with a plurality of contact pads 1920, 1922 at a top surface of the substrate 1910. Although not shown in FIG. 19, the contact pads 1920, 1922 may be electrically coupled through additional traces on the substrate 1910 to other system components. A thermal structure 1932 (e.g., a conductive coin or other structure) is brought into contact with the inserted surface of the device 1900, and is physically and electrically coupled to the device 1900 (e.g., with die attach, thermal grease, or other conductive material). Finally, a heat sink 1930 may be coupled to the thermal structure 1932.

Figure 20:
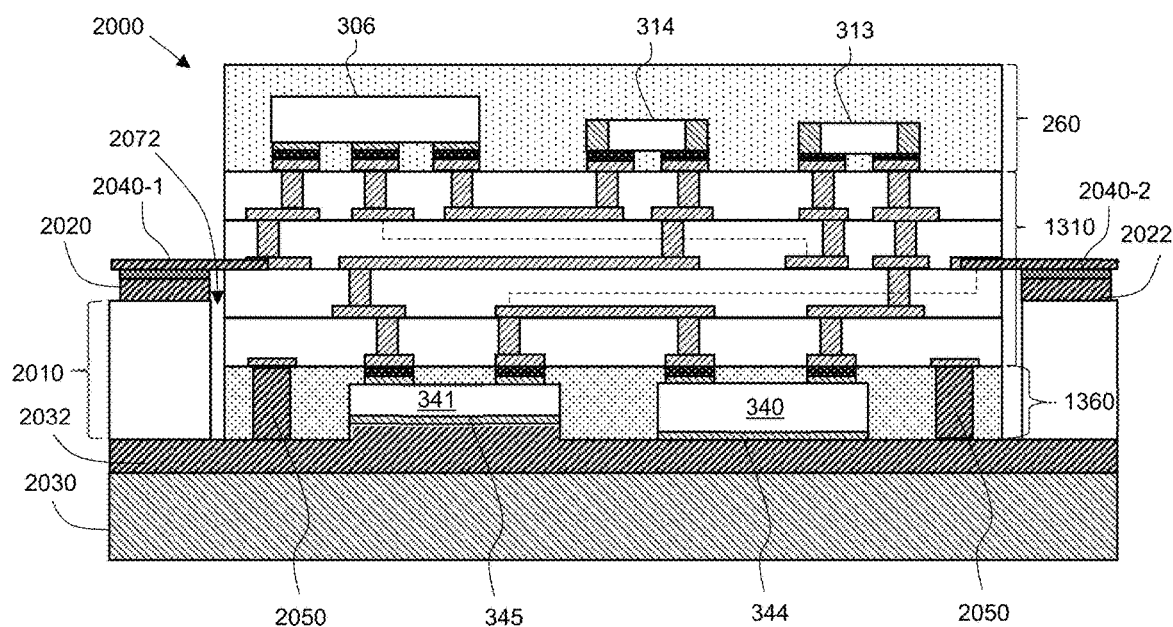
FIG. 20 is a side, cross-sectional view of yet another embodiment of a power amplifier device with side terminals, according to another example embodiment.

FIG. 20 is side, cross-sectional view of yet another embodiment of a power amplifier device 2000 with side terminals 2040-1, 2040-2 coupled to a system substrate 2010, according to another example embodiment. Power amplifier device 2000 is similar in many respects to power amplifier device 1300 (FIG. 13), discussed above, except that various terminals of device 2000 extend from the sides of the device, rather than being exposed at the lower surface of the device. Where elements in power amplifier device 2000 are substantially identical to elements in power amplifier device 1300, the same reference numbers will be used, and all details discussed above with respect to such elements apply equally to the same-numbered elements in FIG. 20. For purpose of brevity, all details will not be repeated here.

Portions of power amplifier device 2000 that are substantially the same as corresponding portions of power amplifier device 1300 include device substrate 1310, power transistor dies 340, 341 that are embedded in a first encapsulant material layer 1360, and surface mount components 306, 313, 314 that are embedded in a second encapsulant material layer 260.

Device 2000 also may include optional interconnects 2050, which also are embedded in the first encapsulant material layer 1360. These interconnects 2050 are similar to interconnects 1340-1, 1340-2 (FIG. 13), in that they are electrically connected through the patterned conductive layers and vias of the substrate 1310 to various components and circuits embedded in device 2000. However, unlike interconnects 1340-1, 1340-2, which function as I/O, ground, and bias terminals, interconnects 2050 only provide for ground connections for the various components and circuits embedded within the device 2000.

In order to provide I/O and bias connections, device 2000 includes a plurality of side leads (e.g., leads 2040-1, 2040-2), which extend perpendicularly from the sides of device 2000, and more particularly from the sides of device substrate 1310. The leads 2040-1, 2040-2 are electrically coupled through the patterned conductive layers and vias of the device substrate 1310 to the various dies 340, 341 and surface mount components 306, 313, 314.

According to an embodiment, each of the leads 2040-1, 2040-2 electrically connects to at least one conductive portion of one of the embedded conductive layers (e.g., any of layers 357-359, FIG. 13) of the device substrate 1310. At least one lead (e.g., lead 2040-1) corresponds to the RF input for the amplifier device 2000 (e.g., input 102, FIG. 1), and at least one other lead (e.g., lead 2040-2) corresponds to the RF output for the amplifier device 2000 (e.g., output 104, FIG. 1). As shown in FIG. 20, for example, lead 2040-1 is electrically coupled through the patterned conductive layers and vias to surface mount device 306 (e.g., to the input terminal of a splitter), and lead 2040-2 is electrically coupled through the patterned conductive layers and vias (as indicated with a dashed line) to the drain terminal of power transistor die 341. As discussed above, the drain terminal of power transistor die 341 may correspond to the combining node of a Doherty amplifier, and thus lead 2040-2 is electrically coupled to the combining node.

To incorporate the device 2000 into a larger system, a lower half of the device 2000 is inserted into an opening 2072 in a system substrate 2010. Again, the system substrate 2010 may be, for example, a PCB with a plurality of contact pads 2020, 2022 at a top surface of the substrate 2010. Although not shown in FIG. 20, the contact pads 2020, 2022 may be electrically coupled through additional traces on the substrate 2010 to other system components. A thermal structure 2032 (e.g., a conductive coin or other structure) is brought into contact with the inserted surface of the device 2000, and is physically and electrically coupled to the exposed conductive layers 344, 345 of the dies 340, 341 with conductive die attach. Finally, a heat sink 2030 may be coupled to the thermal structure 2032.

An embodiment of a power amplifier device has a first device surface and an opposed second device surface. The power amplifier device includes a substrate, a power transistor die, and one or more surface mount components. The substrate is formed from a stack of multiple dielectric layers and multiple patterned conductive layers in an alternating arrangement, and a plurality of conductive vias electrically connecting the patterned conductive layers. The substrate has a first substrate surface, an opposed second substrate surface, first and second substrate die contacts exposed at the first substrate surface, and a plurality of additional substrate contacts exposed at the second substrate surface. The first power transistor die has a first die surface and an opposed second die surface and includes first and second die contacts at the first die surface and connected to the first and second substrate contacts, respectively, a third die contact at the second die surface, and at least one integrated transistor. The at least one integrated transistor includes a control terminal coupled to the first die contact, a first current conducting terminal coupled to the second die contact, and a second current conducting terminal coupled to the third die contact. The one or more surface-mount components are connected to the plurality of additional substrate components at the second substrate surface, and the one or more surface-mount components are electrically coupled through the patterned conductive layers and the conductive vias to the first and second die contacts. The power amplifier device also includes a first encapsulation material layer covering the one or more surface-mount components and the second substrate surface. The first encapsulation material layer defines the second surface of the power amplifier device.

An embodiment of an amplifier system includes a system substrate and a power amplifier device coupled to the system substrate. The power amplifier includes a first device surface, an opposed second device surface, a substrate, a power transistor die, and one or more surface mount components. The substrate is formed from a stack of multiple dielectric layers and multiple patterned conductive layers in an alternating arrangement, and a plurality of conductive vias electrically connecting the patterned conductive layers. The substrate has a first substrate surface, an opposed second substrate surface, first and second substrate die contacts exposed at the first substrate surface, and a plurality of additional substrate contacts exposed at the second substrate surface. The first power transistor die has a first die surface and an opposed second die surface and includes first and second die contacts at the first die surface and connected to the first and second substrate contacts, respectively, a third die contact at the second die surface, and at least one integrated transistor. The at least one integrated transistor includes a control terminal coupled to the first die contact, a first current conducting terminal coupled to the second die contact, and a second current conducting terminal coupled to the third die contact. The one or more surface-mount components are connected to the plurality of additional substrate components at the second substrate surface, and the one or more surface-mount components are electrically coupled through the patterned conductive layers and the conductive vias to the first and second die contacts. The power amplifier device also includes a first encapsulation material layer covering the one or more surface-mount components and the second substrate surface. The first encapsulation material layer defines the second surface of the power amplifier device.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A power amplifier device with a first device surface and an opposed second device surface, the power amplifier device comprising:
    a substrate formed from a stack of multiple dielectric layers and multiple patterned conductive layers in an alternating arrangement, and a plurality of conductive vias electrically connecting the patterned conductive layers, wherein the substrate has a first substrate surface, an opposed second substrate surface, first and second substrate die contacts exposed at the first substrate surface, and a plurality of additional substrate contacts exposed at the second substrate surface;
    a first power transistor die with a first die surface and an opposed second die surface and including
        first and second die contacts at the first die surface and connected to the first and second substrate die contacts, respectively,
        a third die contact at the second die surface, and
        at least one integrated transistor, wherein the at least one integrated transistor includes a control terminal coupled to the first die contact, a first current conducting terminal coupled to the second die contact, and a second current conducting terminal coupled to the third die contact;
    one or more surface-mount components connected to the plurality of additional substrate components at the second substrate surface, wherein the one or more surface-mount components are electrically coupled through the patterned conductive layers and the conductive vias to the first and second die contacts; and
    a first encapsulation material layer covering the one or more surface-mount components and the second substrate surface, wherein the first encapsulation material layer defines the second surface of the power amplifier device.

2. The power amplifier device of claim 1, wherein an outermost dielectric layer of the multiple dielectric layers partially defines the first substrate surface, and the first and second substrate die contacts are exposed through an opening in the outermost dielectric layer.

3. The power amplifier device of claim 2, wherein a gap between sides of the first power transistor die and sidewalls of the opening is filled with molding compound.

4. The power amplifier device of claim 2, further comprising:
    a first conductive interconnect extending through the outermost dielectric layer and having a first end exposed at the first substrate surface and a second end electrically coupled to the multiple patterned conductive layers, and wherein the first conductive interconnect is electrically coupled to the control terminal; and
    a second conductive interconnect extending through the outermost dielectric layer and having a first end exposed at the first substrate surface and a second end electrically coupled to the multiple patterned conductive layers, and wherein the second conductive interconnect is electrically coupled to the first current conducting terminal.

5. The power amplifier device of claim 2, further comprising:
a first conductive interconnect extending through the first encapsulation material layer and having a first end exposed at the second substrate surface and a second end electrically coupled to the multiple patterned conductive layers, and wherein the first conductive interconnect is electrically coupled to the control terminal; and
a second conductive interconnect extending through the first encapsulation material layer and having a first end exposed at the second substrate surface and a second end electrically coupled to the multiple patterned conductive layers, and wherein the second conductive interconnect is electrically coupled to the first current conducting terminal.

6. The power amplifier device of claim 1, further comprising:
a first side terminal extending from a first side of the substrate and having a first end that is exposed and a second end electrically coupled to the multiple patterned conductive layers, and wherein the first side terminal is electrically coupled to the control terminal; and
a second side terminal extending from a second side of the substrate and having a first end that is exposed and a second end electrically coupled to the multiple patterned conductive layers, and wherein the second side terminal is electrically coupled to the first current conducting terminal.

7. The power amplifier device of claim 1, wherein the third die contact comprises a conductive layer at the second die surface, and wherein the power amplifier further comprises:
a thermal structure coupled to the conductive layer with a die attach material.

8. The power amplifier device of claim 1, wherein the first and second substrate contacts are located at the first substrate surface.

9. The power amplifier device of claim 8, further comprising:
a second encapsulation material layer covering the first power transistor die and the first substrate surface, wherein the second encapsulation material layer defines the first surface of the power amplifier device.

10. The power amplifier device of claim 9, further comprising:
a first conductive interconnect extending through the second encapsulation material layer and having a first end exposed at the first substrate surface and a second end electrically coupled to the multiple patterned conductive layers, and wherein the first conductive interconnect is electrically coupled to the control terminal; and
a second conductive interconnect extending through the second encapsulation material layer and having a first end exposed at the first substrate surface and a second end electrically coupled to the multiple patterned conductive layers, and wherein the second conductive interconnect is electrically coupled to the first current conducting terminal.

11. The power amplifier device of claim 9, further comprising:
a first conductive interconnect extending through the first encapsulation material layer and having a first end exposed at the second substrate surface and a second end electrically coupled to the multiple patterned conductive layers, and wherein the first conductive interconnect is electrically coupled to the control terminal; and
a second conductive interconnect extending through the first encapsulation material layer and having a first end exposed at the second substrate surface and a second end electrically coupled to the multiple patterned conductive layers, and wherein the second conductive interconnect is electrically coupled to the first current conducting terminal.

12. The power amplifier device of claim 1, further comprising:
a first side terminal extending from a first side of the substrate and having a first end that is exposed and a second end electrically coupled to the multiple patterned conductive layers, and wherein the first side terminal is electrically coupled to the control terminal; and
a second side terminal extending from a second side of the substrate and having a first end that is exposed and a second end electrically coupled to the multiple patterned conductive layers, and wherein the second side terminal is electrically coupled to the first current conducting terminal.

13. The power amplifier device of claim 1, further comprising:
third and fourth substrate die contacts exposed at the first substrate surface; and
a second power transistor die with a third die surface and an opposed fourth die surface and including
third and fourth die contacts at the third die surface and connected to the third and fourth substrate contacts, respectively,
a fifth die contact at the fourth die surface, and
at least one additional integrated transistor, wherein the at least one additional integrated transistor includes a control terminal coupled to the third die contact, a first current conducting terminal coupled to the fourth die contact, and a second current conducting terminal coupled to the fifth die contact.

14. The power amplifier device of claim 13, wherein the first and second power transistor die comprise a carrier amplifier die and a peaking amplifier die of a Doherty power amplifier.

15. The power amplifier device of claim 14, wherein the one or more surface mount components form portions of amplifier circuitry selected from pre-amplifier transistors, power splitting circuitry, harmonic termination circuitry, inductors, capacitors, and impedance matching circuitry.

16. An amplifier system comprising:
a system substrate; and
a power amplifier device coupled to the system substrate, wherein the power amplifier device includes
a first device surface,
an opposed second device surface,
a substrate formed from a stack of multiple dielectric layers and multiple patterned conductive layers in an alternating arrangement, and a plurality of conductive vias electrically connecting the patterned conductive layers, wherein the substrate has a first substrate surface, an opposed second substrate surface, first and second substrate die contacts exposed at the first substrate surface, and a plurality of additional substrate contacts exposed at the second substrate surface,
a first power transistor die with a first die surface and an opposed second die surface and including
first and second die contacts at the first die surface and connected to the first and second substrate die contacts, respectively,
a third die contact at the second die surface, and
at least one integrated transistor, wherein the at least one integrated transistor includes a control terminal coupled to the first die contact, a first current conducting terminal coupled to the second die contact, and a second current conducting terminal coupled to the third die contact,
one or more surface-mount components connected to the plurality of additional substrate components at the second substrate surface, wherein the one or more surface-mount components are electrically coupled through the patterned conductive layers and the conductive vias to the first and second die contacts, and
a first encapsulation material layer covering the one or more surface-mount components and the second substrate surface, wherein the first encapsulation material layer defines the second surface of the power amplifier device.

17. The amplifier system of claim 16, wherein the power amplifier device further comprises:
a first conductive interconnect extending through an outermost dielectric layer and having a first end exposed at the first substrate surface and a second end electrically coupled to the multiple patterned conductive layers, and wherein the first conductive interconnect is electrically coupled to the control terminal; and
a second conductive interconnect extending through the outermost dielectric layer and having a first end exposed at the first substrate surface and a second end electrically coupled to the multiple patterned conductive layers, and wherein the second conductive interconnect is electrically coupled to the first current conducting terminal.

18. The amplifier system of claim 16, wherein the power amplifier device further comprises:
a first conductive interconnect extending through the first encapsulation material layer and having a first end exposed at the second substrate surface and a second end electrically coupled to the multiple patterned conductive layers, and wherein the first conductive interconnect is electrically coupled to the control terminal; and
a second conductive interconnect extending through the first encapsulation material layer and having a first end exposed at the second substrate surface and a second end electrically coupled to the multiple patterned conductive layers, and wherein the second conductive interconnect is electrically coupled to the first current conducting terminal.

19. The amplifier system of claim 16, further comprising:
a second encapsulation material layer covering the first power transistor die and the first substrate surface, wherein the second encapsulation material layer defines the first surface of the power amplifier device.

20. The amplifier system of claim 19, further comprising:
a first conductive interconnect extending through the second encapsulation material layer and having a first end exposed at the first substrate surface and a second end electrically coupled to the multiple patterned conductive layers, and wherein the first conductive interconnect is electrically coupled to the control terminal; and
a second conductive interconnect extending through the second encapsulation material layer and having a first end exposed at the first substrate surface and a second end electrically coupled to the multiple patterned conductive layers, and wherein the second conductive interconnect is electrically coupled to the first current conducting terminal.

21. The amplifier system of claim 19, further comprising:
a first conductive interconnect extending through the first encapsulation material layer and having a first end exposed at the second substrate surface and a second end electrically coupled to the multiple patterned conductive layers, and wherein the first conductive interconnect is electrically coupled to the control terminal; and
a second conductive interconnect extending through the first encapsulation material layer and having a first end exposed at the second substrate surface and a second end electrically coupled to the multiple patterned conductive layers, and wherein the second conductive interconnect is electrically coupled to the first current conducting terminal.

\* \* \* \* \*